(12) United States Patent
Padture et al.

(10) Patent No.: US 10,714,269 B2
(45) Date of Patent: Jul. 14, 2020

(54) METHOD OF MAKING COATED SUBSTRATES

(71) Applicant: Brown University, Providence, RI (US)

(72) Inventors: Nitin P. Padture, Providence, RI (US); Yuanyuan Zhou, Providence, RI (US)

(73) Assignee: Brown University, Providence, RI (US)

( * ) Notice: Subject to any disclaimer, the term of this patent is extended or adjusted under 35 U.S.C. 154(b) by 217 days.

(21) Appl. No.: 15/527,186

(22) PCT Filed: Nov. 20, 2015

(86) PCT No.: PCT/US2015/061736
§ 371 (c)(1),
(2) Date: May 16, 2017

(87) PCT Pub. No.: WO2016/081789
PCT Pub. Date: May 26, 2016

(65) Prior Publication Data
US 2017/0365416 A1 Dec. 21, 2017

Related U.S. Application Data

(60) Provisional application No. 62/082,209, filed on Nov. 20, 2014.

(51) Int. Cl.
*H01G 9/20* (2006.01)
*H01L 51/00* (2006.01)
*H01L 51/42* (2006.01)

(52) U.S. Cl.
CPC ....... *H01G 9/2009* (2013.01); *H01L 51/0003* (2013.01); *H01L 51/005* (2013.01); *H01L 51/0007* (2013.01); *H01L 51/0032* (2013.01); *H01L 51/422* (2013.01);
(Continued)

(58) Field of Classification Search
CPC .............. H01G 9/2009; H01L 51/0032; H01L 51/4213; H01L 51/005; H01L 51/007; H01L 51/4226; H01L 51/422; H01L 51/0003; Y02P 70/521; Y02E 10/549
See application file for complete search history.

(56) References Cited

U.S. PATENT DOCUMENTS

| 5,866,471 A | 2/1999 | Beppu et al. |
| 8,617,642 B2 | 12/2013 | Joo et al. |
| 2012/0111403 A1 | 5/2012 | Ahn et al. |

(Continued)

OTHER PUBLICATIONS

Jeon et al., "Solvent Engineering for high-performance inorganic-organic hybrid perovskite solar cells", Nature Materials 13, Jun. 6, 2014.*

(Continued)

*Primary Examiner* — Matthew T Martin
(74) *Attorney, Agent, or Firm* — Adler Pollock & Sheehan P.C.

(57) ABSTRACT

Methods' and compositions for making coated substrates using a co-solvent method are disclosed. Embodiments of the present disclosure relate in general to methods and compositions for making thin films of organometallic halides. According to one aspect, organometallic halides are deposited from solution on the surface of a substrate at temperatures between about 10 C and 50 C. According to one aspect, organometallic halides are deposited from solution on the surface of a substrate at room temperature.

27 Claims, 13 Drawing Sheets

(52) U.S. Cl.
CPC ...... *H01L 51/4213* (2013.01); *H01L 51/4226* (2013.01); *Y02E 10/549* (2013.01); *Y02P 70/521* (2015.11)

(56) References Cited

U.S. PATENT DOCUMENTS

2013/0309613 A1 11/2013 O'Malley et al.
2014/0256081 A1 9/2014 Hammond et al.

OTHER PUBLICATIONS

Chen et al., "Planar Heterojunction Perovskite Solar Cells via Vapor-Assisted Solution Process", J. Am. Chem. Soc., vol. 136, 2014, pp. 622-625.

Cheng et al., "Layered Organic-Inorganic Hybrid Perovskites: Structure, Optical Properties, Film Preparation, Patterning and Templating Engineering", Cryst. Eng. Comm., vol. 12, 2010, pp. 2646-2662.

Christians et al., "An Inorganic Hole Conductor for Organo-Lead Halide Perovskite Solar Cells. Improved Hole Conductivity with Copper Iodide", J. Am. Chem. Soc., vol. 136, 2014, pp. 758-764.

Gratzel et al., "The Light and Shade of Perovskite Solar Cells", Nature Mater., vol. 13, No. 9, 2014, pp. 838-842.

Hao et al., "Anomalous Band Gap Behavior in Mixed Sn and Pb Perovskites Enables Broadening of Absorption Spectrum in Solar Cells", Journal of American Chemical Society, vol. 136, 2014, pp. 8094-8099.

Jeon et al., "Solvent Engineering for High-performance Inorganic-organic Hybrid Perovskite Solar Cells", Nature Materials, vol. 13, No. 9, 2014, pp. 897-903.

Juarez-Perez et al., "Role of the Selective Contacts in the Performance of Lead Halide Perovskite Solar Cells", J Phys. Chem. Lett., vol. 5, 2014, pp. 680-685.

Jung et al., "Perovskite Solar Cells: From Materials to Devices", Small., vol. 11, No. 1, 2014, pp. 10-25.

Kim et al., "Lead Iodide Perovskite Sensitized All-Solid-State Submicron Thin Film Mesoscopic Solar Cell with Efficiency Exceeding 9%", Scientific Reports, vol. 2, No. 591, 2012, 7 pages.

Kojima et al., "Organometal Halide Perovskites as Visible-Light Sensitizers for Photovoltaic Cells", J. Am. Chem. Soc., vol. 131, No. 17, 2009, pp. 6050-6051.

Kutes et al., "Direct Observation of Ferroelectric Domains in Solution-Processed CH3NH3PbI3 Perovskite Thin Films", J Phys Chem Lett., vol. 5, No. 19, 2014, pp. 3335-3339.

Lee et al., "Efficient Hybrid Solar Cells Based on Meso-Superstructured Organometal Halide Perovskites", Science, vol. 338, Nov. 2, 2012, pp. 643-647.

Liu et al., "Efficient Planar Heterojunction Perovskite Solar Cells by Vapour Deposition", Nature, vol. 501, No. 7467, Sep. 19, 2013, pp. 395-398.

Malinkiewicz et al., "Perovskite Solar Cells Employing Organic Charge-Transport Layers", Nature Photonics, vol. 8, No. 2, 2013, pp. 128-132.

McGehee, "Materials Science: Fast-Track Solar Cells", Nature, vol. 501, No. 7467, Sep. 19, 2013, pp. 323-325.

Ono et al., "Fabrication of Semi-Transparent Perovskite Films With Centimeter-scale Superior Uniformity by the Hybrid Deposition Method", Energy & Environmental Science, vol. 7, 2014, pp. 3989-3993.

International Search Report and Written Opinion received in PCT Application No. PCT/US2015/061736, dated Jan. 22, 2016, 8 Pages.

Snaith, "Perovskites: The Emergence of a New Era for Low-Cost, High-Efficiency Solar Cells", Journal of Physical Chemistry Letters, vol. 4, No. 21, 2013, pp. 3623-3630.

Stoumpos et al., "Semiconducting Tin and Lead Iodide Perovskites With Organic Cations: Phase Transitions, High Mobilities, and Near-Infrared Photoluminescent Properties", Inorg Chem., vol. 52, 2013, pp. 9019-9038.

Stranks et al., "Electron-Hole Diffusion Lengths Exceeding 1 Micrometer in an Organometal Trihalide Perovskite Absorber", Science, vol. 342, Oct. 18, 2013, pp. 341-344.

Xiao et al., "A Fast Deposition-Crystallization Procedure for Highly Efficient Lead Iodide Perovskite Thin-Film Solar Cells", Angew Chem Int Ed Engl., vol. 53, No. 37, 2014, pp. 9898-9903.

Xiao et al., "Efficient, High Yield Perovskite Photovoltaic Devices Grown by Interdiffusion of Solution-processed Precursor Stacking Layers", Energy & Environmental Science, vol. 7, 2014, pp. 2619-2623.

Xing et al., "Long-Range Balanced Electron- and Hole-Transport Lengths in Organic-Inorganic CH3NH3PbI3", Science, vol. 342, No. 6156, Oct. 18, 2013, pp. 344-347.

Zhao et al., "Efficient Planar Perovskite Solar Cells Based on 1.8 eV Band Gap CH3NH3PbI2Br Nanosheets via Thermal Decomposition", J. Am. Chem. Soc., vol. 136, 2014, pp. 12241-12244.

Zhao et al., "Solution Chemistry Engineering toward High-Efficiency Perovskite Solar Cells", J. Phys. Chem. Lett., vol. 5, No. 23, 2014, pp. 4175-4186.

Zhou et al., "Interface Engineering of Highly Efficient Perovskite Solar Cells", Science, vol. 345, Issue 6196, Aug. 1, 2014, pp. 542-546.

\* cited by examiner

Figure 1A
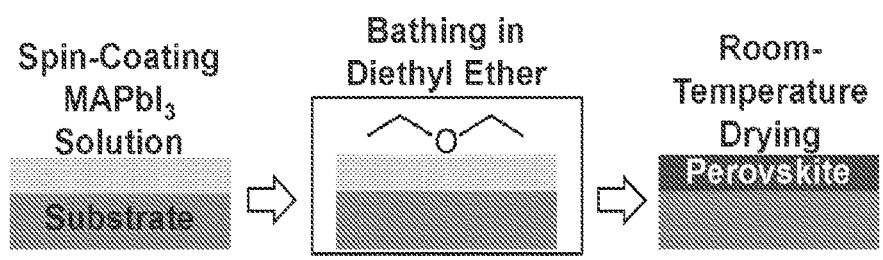
Figure 1B
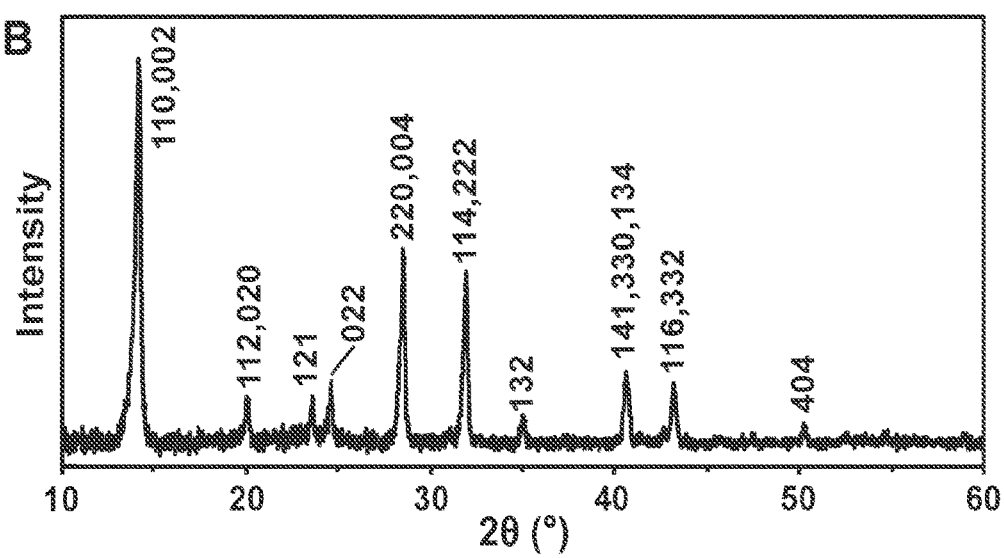
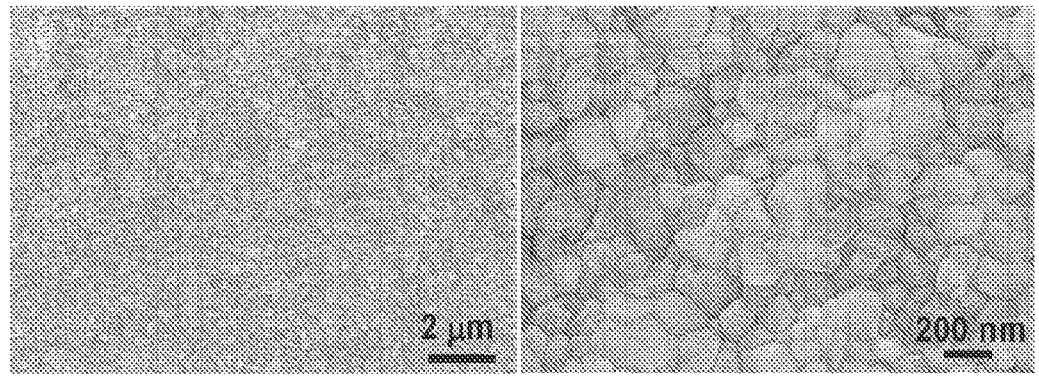
Figure 1C              Figure 1D

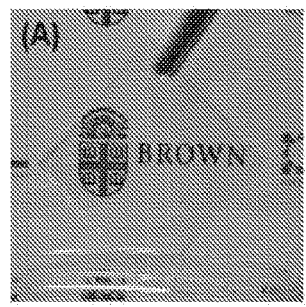 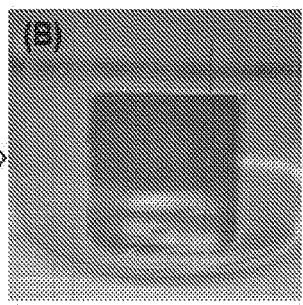 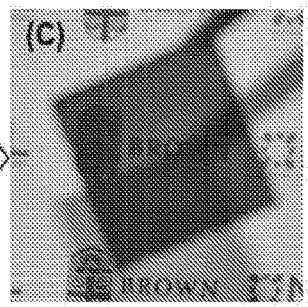
Figure 2A  Figure 2B  Figure 2C
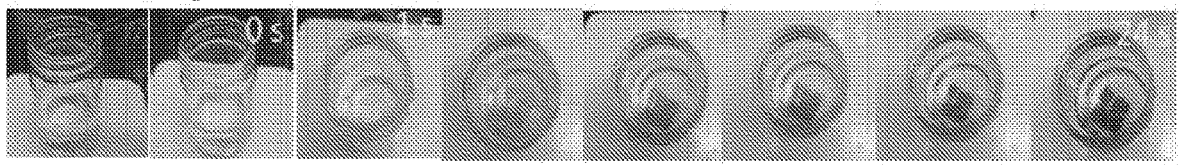
Figure 3
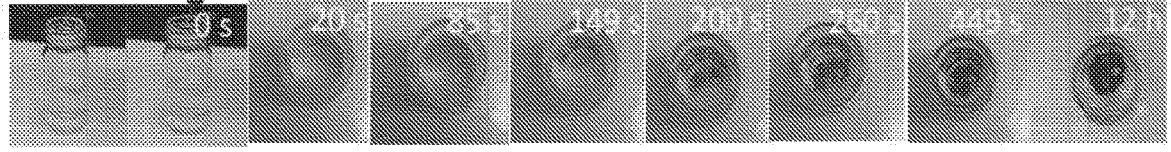
Figure 4

Figure 5A
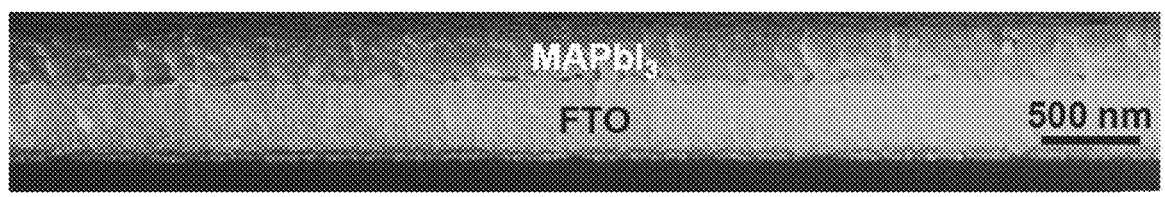
Figure 5B
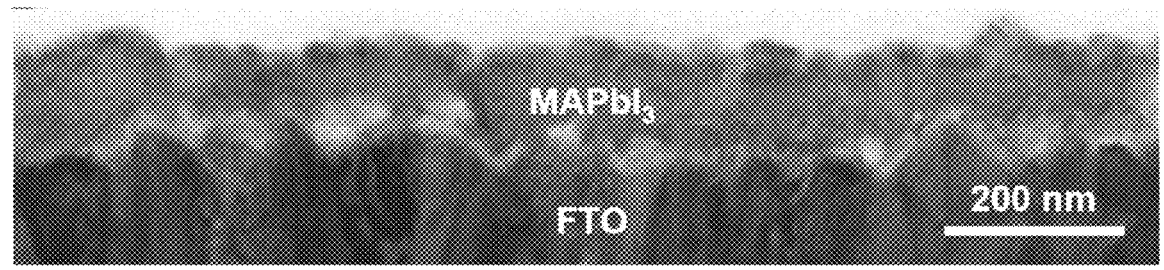
Figure 5C
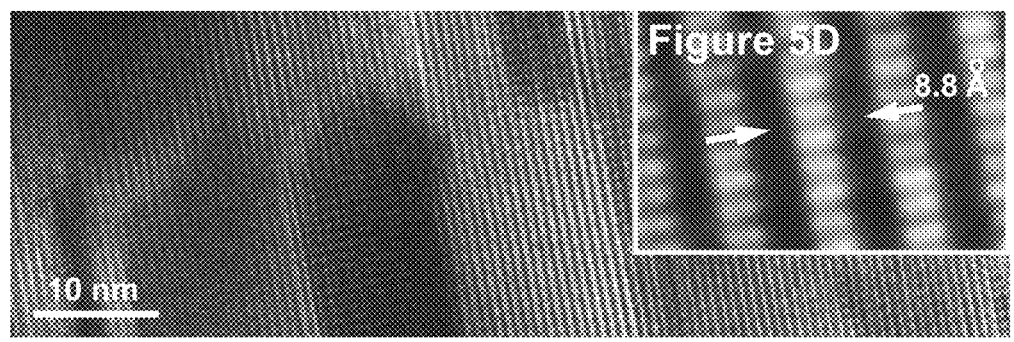
Figure 5E
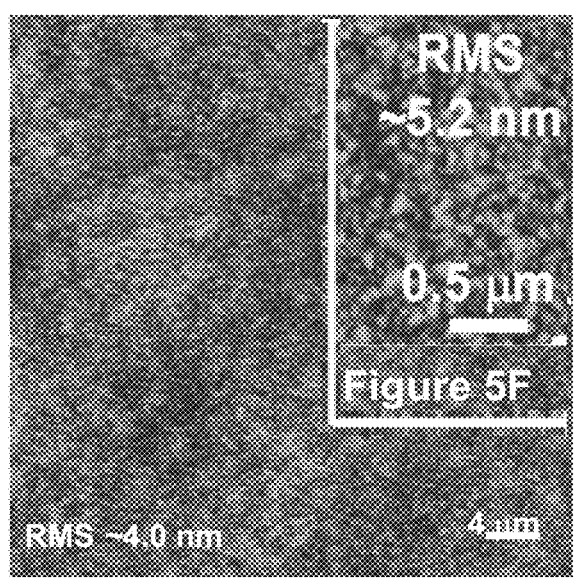
Figure 5H
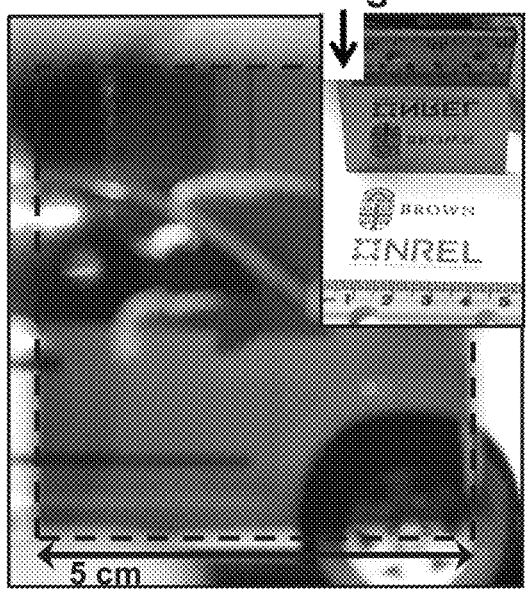
Figure 5G

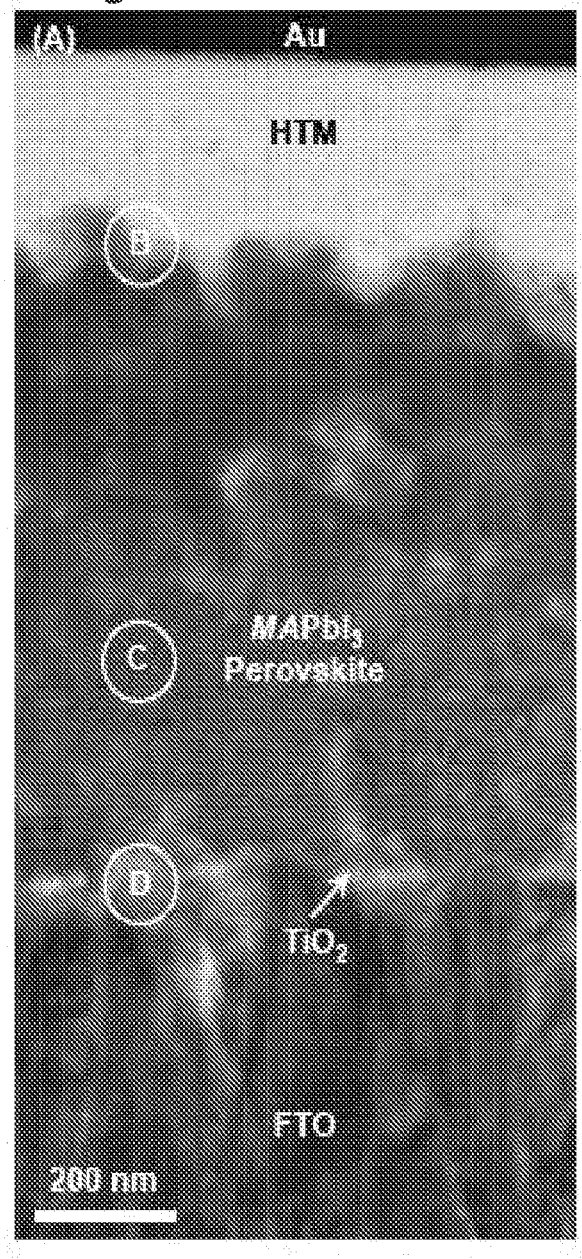
Figure 8A
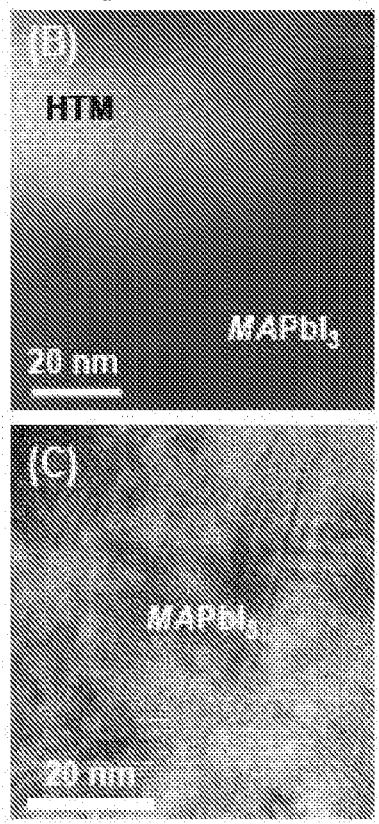
Figure 8B
Figure 8C
Figure 8D

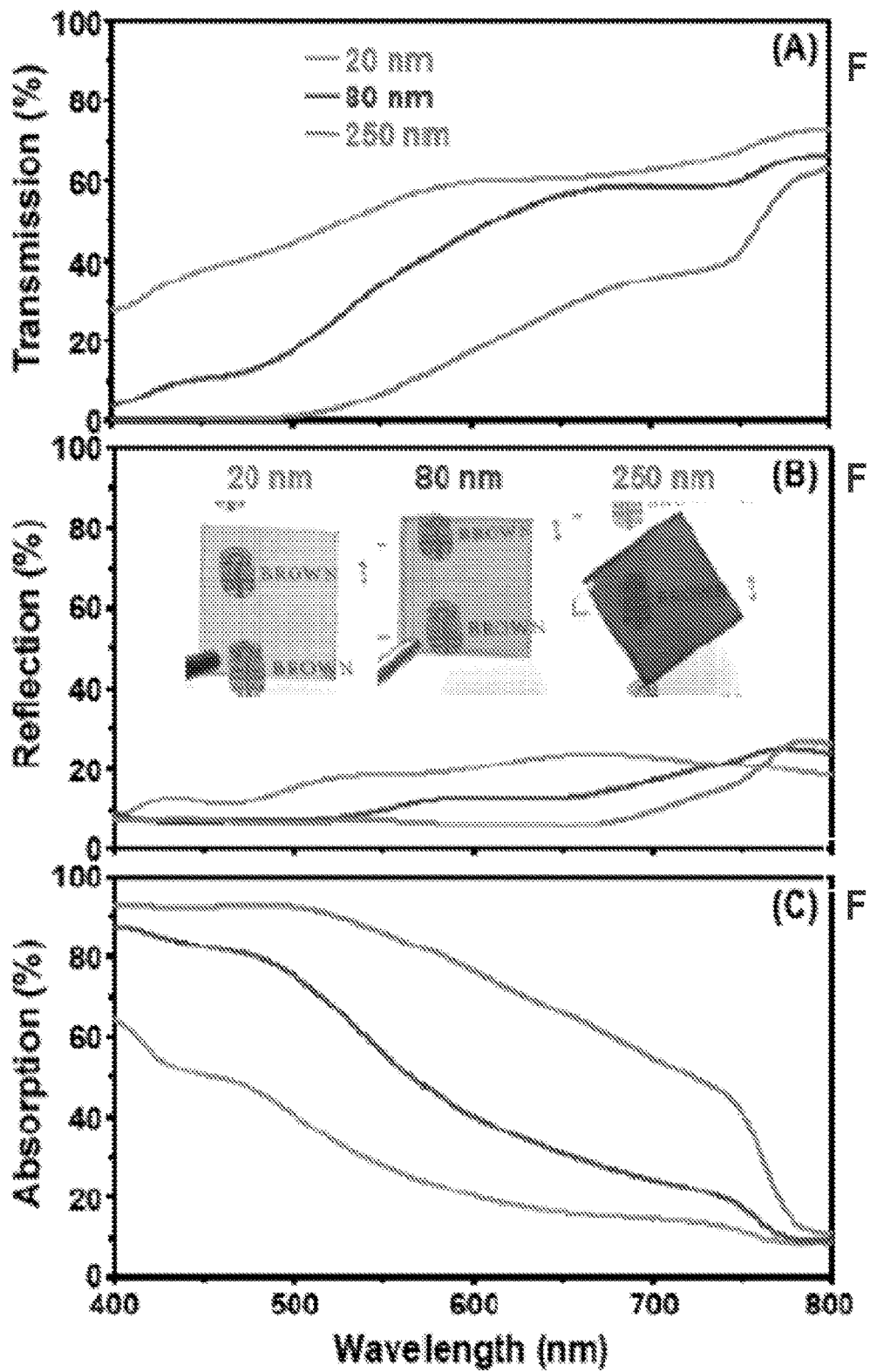

METHOD OF MAKING COATED SUBSTRATES

RELATED APPLICATION DATA

This application is a national phase filing under 35 U.S.C. § 371 of International Application No. PCT/US15/61736 filed Nov. 20, 2015, which claims priority to U.S. Provisional Patent Application No. 62/082,209, filed on Nov. 20, 2014, the entire contents of which are hereby incorporated herein by reference.

STATEMENT OF GOVERNMENT INTERESTS

This invention was made with government support under DMR-1305913 from National Science Foundation. The Government has certain rights in the invention.

BACKGROUND

Field of the Invention

Embodiments of the present invention relate in general to a method of making a coated substrate for use in a solar cell by forming crystals of an organometallic halide on a substrate surface using a co-solvent method of precipitation.

Description of Related Art

The field of thin-film photovoltaics includes perovskite solar cells that use hybrid perovskites as the light absorber. Methylammonium (MA) lead triiodide ($CH_3NH_3PbI_3$ or $MAPbI_3$) is an exemplary perovskite that has been used in solar cells. See, H. J. Snaith, *J. Phys. Chem. Lett.* 4, 3623-3630 (2013); M. D. McGhee, *Nature* 501, 323-325 (2013); M. Grätzel, *Nature Mater.* 13, 838-842 (2014) and H. S. Jung, N.-G. Park, *Small* DOI: 10.1002/smll.201402767 (2014) in press. $MAPbI_3$ possesses a combination of desirable properties, including favorable direct band gap (1.50 to 1.55 eV), large absorption coefficient in the visible spectrum, high carrier mobilities and long carrier-diffusion lengths for both electrons and holes. See G. Xing, N. Mathews, S. Sun, S. S. Lim, Y. M. Lam, M. Grätzel, S. Mhaisalkar, T. C. Sum, *Science* 342, 344-347 (2013); S. D. Stranks, G. E. Eperon, G. Grancini, C. Menelaou, M. J. P. Alcocer, T. Leijtens, L. M. Herz, A. Petrozza, H. J. Snaith, *Science* 342, 341-344 (2013).

This has resulted in $MAPbI_3$-based solar cells with power conversion efficiencies exceeding 20% (see world wide website nre1.gov/nepv/images/efficiency_chart.jpg as of Nov. 15, 2014) compared to earlier results. See A. Kojima, K. Teshima, Y. Shirai, T. Miyasaka, *J. Am. Chem. Soc.* 131, 6050-6051 (2009).

Typically, the perovskite layer, either as a planar thin film or within mesoscopic oxide scaffolds, is deposited using solution methods including a polar high boiling point solvent. See, H. J. Snaith, *J. Phys. Chem. Lett.* 4, 3623-3630 (2013); M. D. McGhee, *Nature* 501, 323-325 (2013); M. Grätzel, *Nature Mater.* 13, 838-842 (2014) and H. S. Jung, N.-G. Park, Small DOI: 10.1002/smll.201402767 (2014) in press; Y. Zhao, K. Zhu, *J. Phys. Chem. Lett. DOI:* 10.1021/jz501983v (2014). In the case of planar solar cells, the solution-based deposition of the perovskite film is typically accomplished by heating to a high temperature to remove the polar high boiling point solvent thereby causing deposition of perovskite crystals on the substrate surface. Vapor-based methods, either all-vapor or combined with solution-methods, are also used for depositing thin films of perovskite, but the need for vacuum equipment and batch-processing presents fundamental limitations on the manufacturing scalability of these methods. Also, fabrication of full-coverage perovskite films of sub-100 nm thickness is challenging for both the solution-based and the vapor-based methods. Thus, the scalable deposition of high quality perovskite thin films of a wide range of uniform thicknesses remains a challenge. See generally, M. Liu, M. B. Johnston, H. J. Snaith, *Nature* 501, 395-398 (2013); Y. Zhao, K. Zhu, *J. Phys. Chem. Lett.* DOI: 10.1021/jz501983v (2014); M. Liu, M. B. Johnston, H. J. Snaith, *Nature* 501, 395-398 (2013); H. Zhou, Q. Chen, G. Li, S. Luo, T.-B. Song, H.-S. Duan, Z. Hong, J. You, Y. Yang, *Science* 345, 542-546 (2014); J.-H. Im, I. H. Jang, N. Pellet, M. Grätzel, N.-G. Park, *Nature Nanotechnol.* 9, 897-903 (2014); Z. Xiao, C. Bi, Y. Shao, Q. Dong, Y. Yuan, C. Wang, Y. Gao, J. Huang, *Energy Environ. Sci.* 7, 2619-2623 (2014); N. J. Jeon, J. H. Noh, Y. C. Kim, W. S. Yang, S. Ryu, S. I. Seok, *Nature Mater.* 9, 897-903 (2014); M. Xiao, F. Huang, W. Huang, Y. Dkhissi, Y. Zhu, J. Etheridge, A. Gray-Weale, U. Bach, Y.-B. Cheng, L. Spiccia, *Angew. Chem. Intl. Ed.* 53, 9898-9903 (2014); Y. Kutes, L. Ye, Y. Zhou, S. Pang, B. D. Huey, N. P. Padture, *J. Phys. Chem. Lett.* 5, 3335-3339 (2014); O. Malinkiewicz, A. Yella, Y. H. Lee, G. M. Espallargas, M. Grätzel, M. K. Nazeeruddin, H. J. Bolnik, *Nature Photon.* 8, 128-132 (2013); L. K. Ono, S. Wang, Y. Kato, S. R. Raga, Y. Qi, *Energy Environ. Sci.* 7, 3989-3993 (2014); Q. Chen, H. Zhou, Z. Hong, S. Luo, H.-S. Duan, H.-H. Wang, Y. Liu, G. Li, Y. Yang, *J. Am. Chem. Soc.* 136, 622-625 (2014); F. Hao, C. C. Stoumpos, Z. Liu, R. P. H. Chang, M. G. Kanatzidis, *Journal of American Chemical Society* DOI: 10.1021/ja509245x (2014) in press.

SUMMARY

Embodiments of the present disclosure relate in general to methods and compositions for making thin films of organometallic halides. According to one aspect, organometallic halides are deposited from solution on the surface of a substrate at temperatures between about 10° C. and 50° C. According to one aspect, organometallic halides are deposited from solution on the surface of a substrate at room temperature.

According to one aspect, organometallic halides are deposited from a solution including a first solvent provided on the surface of a substrate when the solution on the substrate is contacted with a second solvent which extracts the first solvent from the solution on the surface of the substrate. As a result of the extraction of the first solvent on the surface of the substrate into the second solvent, the organometallic halides crystallize from solution onto the surface of the substrate. According to one aspect, the organometallic halides are deposited from solution on the surface of a substrate after being contacted with the second solvent at temperatures between about 10° C. and 50° C., such as room temperature.

According to one aspect, the first solvent has a high boiling point and is a solvent for the organometallic halide. According to one aspect, the second solvent has a low boiling point and is a solvent for the first solvent. According to one aspect, the second solvent is a poor solvent for the organometallic halide or the organometallic halide is insoluble, substantially insoluble or insubstantially soluble in the second solvent. According to one aspect, the organometallic halide has little or no solubility in the second solvent.

According to certain aspects, the present disclosure is directed to a solvent-solvent extraction method that is used to deposit organometallic halides, such as hybrid-perovskites, as thin films on substrates, such as substrates used in solar cells. According to this aspect, solvent-solvent extraction is used to induce crystallization of organometallic halides, such as hybrid-perovskites, and film formation between about 10 seconds and about 5 minutes at a temperature of between about 10° C. and 50° C., such as room temperature. Various substrate sizes and surface areas can be used in the practice of the present methods which facilitate deposition of organometallic halide thin films over large surface areas making the methods useful for many different applications such as tandem solar cells or any other large surface area that would benefit from a continuous organometallic halide thin film.

Further features and advantages of certain embodiments of the present disclosure will become more fully apparent in the following description of the embodiments and drawings thereof, and from the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The foregoing and other features and advantages of the present invention will be more fully understood from the following detailed description of illustrative embodiments taken in conjunction with the accompanying drawings in which:

FIG. 1A is a schematic illustration showing the SSE process for the room-temperature deposition of hybrid perovskite thin films. FIG. 1B depicts an indexed XRD pattern. FIG. 1C depicts low-magnification SEM micrographs of the top surface of a MAPbI$_3$ perovskite film deposited on a glass substrate using the SSE method. FIG. 1D depicts high-magnification SEM micrographs of the top surface of a MAPbI$_3$ perovskite film deposited on a glass substrate using the SSE method.

FIG. 2(A)-2(C) are photographs at various stages of the solvent-solvent extraction process described herein.

FIG. 3 are photographs at various stages of the solvent-solvent extraction process described herein.

FIG. 4 are photographs at various stages of the solvent-solvent extraction process described herein.

FIG. 5A depicts a cross-sectional image of MAPbI$_3$ perovskite films deposited on a TiO$_2$-blocking-layer coated FTO-glass substrate using SEM (~250 nm film thickness). FIG. 5B depicts a cross-sectional image of MAPbI$_3$ perovskite films deposited on a TiO$_2$-blocking-layer coated FTO-glass substrate using bright-field TEM (~80 nm film thickness). The light contrast at the interface between the FTO and the perovskite is the TiO$_2$ blocking layer. FIG. 5C depicts a high-resolution TEM plan view image of a MAPbI$_3$ perovskite film deposited on a TEM grid using the SSE method showing lattice imaging and defects. FIG. 5D shows 100 or 010 lattice planes, and other fine structure. FIG. 5E is a large area image (40×40 m$^2$) AFM image of a MAPbI$_3$ perovskite film (~250 nm thickness) deposited on a TiO$_2$-blocking-layer coated FTO-glass substrate. FIG. 5F is a small area image (2×2 m$^2$) AFM image of a MAPbI$_3$ perovskite film (~250 nm thickness) deposited on a TiO$_2$-blocking-layer coated FTO-glass substrate. FIG. 5G is a photograph of a MAPbI$_3$ perovskite film (~350 nm thickness) deposited on a TiO$_2$-blocking-layer coated FTO-glass substrate (dashed 5×6 cm$^2$ rectangle) held in bright sunshine. FIG. 5H is a photograph of the same film showing high reflectivity.

FIG. 8(A)-8(D) are TEM images of a perovskite-based solar cell.

FIG. 10(A)-10(C) are graphs of transmission, reflection and absorption versus wavelength.

DETAILED DESCRIPTION

Figure 6A:
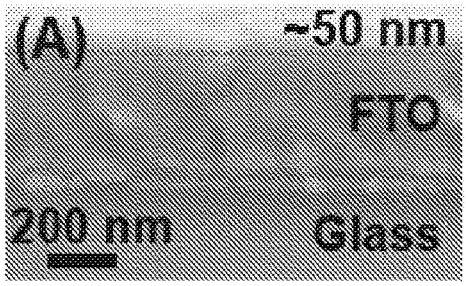
FIG. 6(A)-6(D) are SEM images of perovskite films of various thicknesses.

Embodiments of the present disclosure are directed to the formation of a layer or film or coating of an organometallic halide on the surface of a substrate. According to one aspect, the organometallic halide may be referred to as a pervoskite or a hybrid pervoskite. Pervoskites and hybrid pervoskites and the three dimensional or two dimensional crystal structures they form are known to those of skill in the art and are extensively described in Cheng, et al., *CrystEngComm*, 2010, 12, 2646-2662 hereby incorporated by reference in its entirety for all purposes.

According to one aspect, a method of making a coated substrate is provided that includes contacting a surface of a substrate having a coating of a solution of a first solvent and an organometallic halide thereon with a second solvent, wherein the organometallic halide is insoluble in the second solvent and the first solvent is miscible with the second solvent, wherein the first solvent is extracted from the coating of the solution into the second solvent, and wherein the organometallic halide precipitates from the solution onto the surface of the substrate forming an organometallic halide coating on the substrate. According to one aspect, the coating of the solution is formed by applying the solution to the surface of the substrate. The solution may be applied to the substrate by methods known to those of skill in the art such as spin coating, dip coating, spray coating, ink jet printing or the like. According to one aspect, a portion of the first solvent may be removed such as by evaporation. In this manner, the organometallic halide becomes more concentrated in the solution which is on the surface of the substrate.

Organometallic halides within the scope of the present disclosure are compounds represented by $RMe_nX_y$ wherein Me is Cu, Co, Ni, Fe, Mn, Pd, Cd, Sn, Pb, Ge, Eu or Yb; X is one or more of I, Br, Cl; y is 3 or (3n+1); n is 1, 2, 3, 4, 5; R is an organic group, $CH_3NH_3$, $NH_3CH=CH_2$, Cs, $(R'-NH_3)_2$, $(NH_3-R'-NH_3)_2$ or $(R'-NH_3)_2R_{(n-1)}$; and R' is alkyl, $C_1$ to $C_4$ alkyl or $C_6H_5C_2H_4$; with the proviso that when y is 3, n is 1, Me is Pb, Sn, Ge, Eu or Yb and R is an organic group, $CH_3NH_3$ or $NH_3CH=CH_2$, or Cs, and further with the proviso that when y is (3n+1) and n is 1, Me is Cu, Co, Ni, Fe, Mn, Pd, Cd, Sn, Pb, Ge, Eu or Yb, and R is $(R'-NH_3)_2$ or $(NH_3-R'-NH_3)_2$ and further with the proviso that when y is (3n+1) and n is 2, 3, 4, or 5, Me is Cu, Co, Ni, Fe, Mn, Pd, Cd, Sn, Pb, Ge, Eu or Yb and R is $(R'-NH_3)_2R_{(n-1)}$.

Organometallic halides within the scope of the present disclosure are compounds represented by $RMeX_3$ wherein R is an organic group or Cs, Me is Pb, Sn, Ge, Eu or Yb and X is one or more of I, Br, Cl. According to one aspect, the organic group may be $CH_3NH_3$ or $NH_3CH=CH_2$. An exemplary organometallic halide is $CH_3NH_3PbI_3$.

Organometallic halides within the scope of the present disclosure are compounds represented by $(R-NH_3)_2MeX_4$ wherein R is alkyl or $C_6H_5C_2H_4$, Me is a transition metal or a rare earth metal and X is one or more of Cl, Br, or I. According to one aspect, R is $C_1$ to $C_4$ alkyl or $C_6H_5C_2H_4$, Me is Cu, Co, Ni, Fe, Mn, Pd, Cd, Sn, Pb, Eu or Yb and X is one or more of Cl, Br, or I.

Organometallic halides within the scope of the present disclosure are compounds represented by $(NH_3-R-NH_3)_2MeX_4$ wherein R is alkyl or $C_6H_5C_2H_4$, Me is a transition metal or a rare earth metal and X is one or more of Cl, Br, or I. According to one aspect, R is $C_1$ to $C_4$ alkyl or $C_6H_5C_2H_3$, Me is Cu, Co, Ni, Fe, Mn, Pd, Cd, Sn, Pb, Eu or Yb and X is one or more of Cl, Br, or I.

Organometallic halides within the scope of the present disclosure are compounds represented by $(R'NH_3)_2(R)_{(n-1)}Me_nX_{(3n-1)}$ wherein R' is $C_1$ to $C_4$ alkyl or $C_6H_5C_2H_4$, R is Cs, $CH_3NH_3$ or $NH_3CH=CH_2$, Me is Cu, Co, Ni, Fe, Mn, Pd, Cd, Sn, Pb, Eu or Yb, X is one or more of Cl, Br, or I and n is 2, 3, 4, or 5.

According to one aspect, the first solvent is a polar solvent having a boiling point within the range of 100° C. and 300° C. Exemplary first solvents include dimethylformamide, dimethylsulfoxide, γ-butyrolactone, n-methyl-2-pyrrolidone, dimethylacetamide or dimethylphosphoramide and the like.

According to one aspect, the second solvent is a nonpolar solvent having a boiling point within the range of 0° C. and 100° C. Exemplary second solvents include diethyl ether, pentane, cyclopentane, hexane, cyclohexane, benzene, chloroform, carbon disulphide, cardon tetrachloride, dibutyl ether, diethylamine, trichloroethylene, triethylamine or dichloromethane and the like.

According to one aspect, the organometallic halide is precipitated onto the surface of the substrate forming a coating on the substrate to result in a coated substrate at a temperature between 10° C. and below 70° C., between 10° C. and 50° C., between 20° C. and 30° C. or between 18° C. and 23° C.

Substrates according to the present disclosure are those know to those of skill in the art as being useful in the manufacture of solar cells. Such substrates can also include one or more of a polymer, glass, ceramic, or metal. Substrates according to the present disclosure can be of any three dimensional configuration as desired. An exemplary substrate is a planar substrate.

According to aspects of the present disclosure, the first solvent and the second solvent are selected such that the first solvent is a solvent for the organometallic halide and is miscible with the second solvent. The second solvent is selected such that it is a poor solvent for the organometallic halide. When contacted together, the second solvent extracts the first solvent from the solution and into the second solvent to form a miscible mixture of the second solvent and the first solvent and the organometallic halide crystallizes from solution onto the surface of the substrate forming an organometallic halide coating on the substrate. According to one aspect, after the solution including the first solvent and the organometallic halide is applied to the surface of the substrate, the first solvent is contacted with the second solvent by immersing the substrate in a volume of the second solvent. Other methods may be employed such as dipping the substrate into a volume of the second solvent, spin casting the second solvent onto the surface of the substrate, spraying the first solvent onto the surface of the substrate or any other method known to those of skill in the art for applying a liquid to the surface of a substrate. According to one aspect, immersing the substrate in a volume of the second solvent is exemplary as it facilitates the removal or extraction of the first solvent from the solution applied to the surface of the substrate.

After formation of the organometallic halide coating on the substrate, either the first solvent or the second solvent, if present, is removed from the coated substrate, such as by drying at room temperature or a temperature at which the solvent may evaporate from the coated substrate. An exemplary temperature is between 18° C. and 100° C. Accordingly, if the substrate is immersed in a volume of the second solvent, the substrate is removed and the substrate is then dried.

According to one aspect, the methods described herein deposit high quality hybrid pervoskite thin films or coatings over large areas, such as for high-performance perovskite solar cells, as are known in the art. The thin films, layers or coatings produced by the present method exhibit advantageous phase purity, thickness, uniformity, smoothness and semitransparency compared with perovskite coatings produced by prior methods, such as high temperature methods. According to one aspect, the films, layers or coatings have a thickness of between 20 nm and 2 μm. The thin films, layers or coatings are produced rapidly, i.e. within between 1 second and 5 minutes, between 2 seconds and 3 minutes, or between 30 seconds and 2 minutes. According to one aspect, the film, layer or coating produced by the methods described herein has an average uniform surface roughness of between about 1 nm and 20 nm (root mean square) as measured using an atomic force microscope.

According to one aspect, a solar cell is provided that includes a coated substrate wherein the coating is a room temperature precipitate of an organometallic halide having the formula $RMe_nX_y$ wherein Me is Cu, Co, Ni, Fe, Mn, Pd, Cd, Sn, Pb, Ge, Eu or Yb; X is one or more of I, Br, Cl; y is 3 or (3n+1); n is 1, 2, 3, 4, 5; R is an organic group, $CH_3NH_3$, $NH_3CH=CH_2$, Cs, $(R'—NH_3)_2$, $(NH_3—R'—NH_3)_2$ or $(R'—NH_3)_2R_{(n-1)}$; and R' is alkyl, $C_1$ to $C_4$ alkyl or $C_6H_5C_2H_4$; with the proviso that when y is 3, n is 1, Me is Pb, Sn, Ge, Eu or Yb and R is an organic group, $CH_3NH_3$ or $NH_3CH=CH_2$, or Cs, and further with the proviso that when y is (3n+1) and n is 1, Me is Cu, Co, Ni, Fe, Mn, Pd, Cd, Sn, Pb, Ge, Eu or Yb, and R is $(R'—NH_3)_2$ or $(NH_3—R'—NH_3)_2$ and further with the proviso that when y is (3n+1) and n is 2, 3, 4, or 5, Me is Cu, Co, Ni, Fe, Mn, Pd, Cd, Sn, Pb, Ge, Eu or Yb and R is $(R'—NH_3)_2R_{(n-1)}$.

According to one aspect, a solar cell is provided that includes a coated substrate wherein the coating is a room temperature precipitate of an organometallic halide having the formula $RMeX_3$ wherein R is Cs, $CH_3NH_3$ or $NH_2CH=CH_2$, Me is Pb, Sn, Ge, Eu or Yb and X is one or more of Cl, Br, or I.

According to one aspect, a solar cell is provided that includes a coated substrate wherein the coating is a co-solvent precipitate of an organometallic halide having the formula $RMeX_3$ wherein R is Cs, $CH_3NH_3$ or $NH_2CH=CH_2$, Me is Pb, Sn, Ge, Eu or Yb and X is one or more of Cl, Br, or I.

According to one aspect, a solar cell is provided that includes a coated substrate wherein the coating is a room temperature precipitate of an organometallic halide having the formula $(R—NH_3)_2MeX_4$ wherein R is $C_1$ to $C_4$ alkyl or $C_6H_5C_2H_4$, Me is Cu, Co, Ni, Fe, Mn, Pd, Cd, Sn, Pb, Eu or Yb and X is one or more of Cl, Br, or I.

According to one aspect, a solar cell is provided that includes a coated substrate wherein the coating is a co-solvent precipitate of an organometallic halide having the formula $(R—NH_3)_2MeX_4$ wherein R is $C_1$ to $C_4$ alkyl or $C_6H_5C_2H_4$, Me is Cu, Co, Ni, Fe, Mn, Pd, Cd, Sn, Pb, Eu or Yb and X is one or more of Cl, Br, or I.

According to one aspect, a solar cell is provided that includes a coated substrate wherein the coating is a room temperature precipitate of an organometallic halide having the formula $(NH_3—R—NH_3)_2MeX_4$ wherein R is $C_1$ to $C_4$ alkyl or $C_6H_5C_2H_3$, Me is Cu, Co, Ni, Fe, Mn, Pd, Cd, Sn, Pb, Eu or Yb and X is one or more of Cl, Br, or I.

According to one aspect, a solar cell is provided that includes a coated substrate wherein the coating is a co-solvent precipitate of an organometallic halide having the formula $(NH_3—R—NH_3)_2MeX_4$ wherein R is $C_1$ to $C_4$ alkyl or $C_6H_5C_2H_3$, Me is Cu, Co, Ni, Fe, Mn, Pd, Cd, Sn, Pb, Eu or Yb and X is one or more of Cl, Br, or I.

According to one aspect, a solar cell is provided that includes a coated substrate wherein the coating is a room temperature precipitate of an organometallic halide having the formula $(R'NH_3)_2(R)_{(n-1)}Me_nX_{(3n+1)}$ wherein R' is $C_1$ to $C_4$ alkyl or $C_6H_5C_2H_4$, R is Cs, $CH_3NH_3$ or $NH_2CH=CH_2$, Me is Cu, Co, Ni, Fe, Mn, Pd, Cd, Sn, Pb, Eu or Yb, X is one or more of Cl, Br, or I and n is 2, 3, 4, or 5.

According to one aspect, a solar cell is provided that includes a coated substrate wherein the coating is a co-solvent precipitate of an organometallic halide having the formula $(R'NH_3)_2(R)_{(n-1)}Me_nX_{(3n+1)}$ wherein R' is $C_1$ to $C_4$ alkyl or $C_6H_5C_2H_4$, R is Cs, $CH_3NH_3$ or $NH_2CH=CH_2$, Me is Cu, Co, Ni, Fe, Mn, Pd, Cd, Sn, Pb, Eu or Yb, X is one or more of Cl, Br, or I and n is 2, 3, 4, or 5.

According to one aspect, a coated substrate is produced by the method including contacting a surface of a substrate having a coating of a solution of a first solvent and an organometallic halide thereon with a second solvent, wherein the organometallic halide is insoluble in the second solvent and the first solvent is miscible with the second solvent, wherein the first solvent is extracted from the coating of the solution into the second solvent, and wherein the organometallic halide precipitates from the solution onto the surface of the substrate forming an organometallic halide coating on the substrate. According to this aspect, various solvents organometallic halides, substrates and conditions described herein may be used.

The following examples are set forth as being representative of the present invention. These examples are not to be construed as limiting the scope of the invention as these and other equivalent embodiments will be apparent in view of the present disclosure, figures and accompanying claims.

EXAMPLE I

Deposition of Organometallic Halide Thin Films

All reagent grade chemicals are commercially obtained from Sigma-Aldrich (St. Louis, Mo.) unless noted otherwise.

Methylammonium iodide ($CH_3NH_3I$ or MAI) was prepared using a process as described in M. M. Lee, J. Teuscher, T. Miyasaya, T. N. Murakami, H. J. Snaith, Science 338, 643-647 (2012). In a typical procedure, 24 ml of 33 wt % methylamine ($CH_3NH_2$) solution in anhydrous ethanol was reacted with 10 ml of 57 wt % hydroiodic acid (HI) in water, in 100 ml of ethanol (excess $CH_3NH_2$) in a dry argon atmosphere at room temperature. The solvent and the excess $CH_3NH_2$ were removed using a rotary evaporator, and the resulting MAI powder was obtained. For preparation of $CH_3NH_3Br$ (MABr) the same procedure was followed except HI was replaced by HBr.

For typical preparation of $MAPbI_3$ perovskite films using the solven-solvent extraction (SSE) method, a solution of $PbI_2$ (Alfa-Aesar, Ward Hill, Mass.) and MAI from (molar ratio 1:1) in N-Methyl-2-pyrrolidone (NMP) was first spin-coated onto previously patterned fluorine-doped tin oxide (FTO) coated glass substrates (TEC 15, Hartford Glass Co., Hartford City, Ind.). The spin-coated substrate with the solution film was immersed in anhydrous diethyl ether (Fisher Scientific, Fair Lawn, N.J.). After 2 min, a brown film was formed on the substrate. The substrate was taken out and dried rapidly in the ambient atmosphere due to the highly evaporative nature of the diethyl ether. The entire perovskite film fabrication process was performed in an ambient atmosphere with about 30% humidity. The thickness of the resultant perovskite film was controlled by varying the perovskite solution concentration and the spinning rate. Films of thickness 20 nm, 80 nm, 250 nm were processed using 15 wt %, 30 wt %, and 42 wt % solutions at 6000 rpm (10 s), 6000 rpm (10 s), and 4500 rpm (15 s), respectively. For the preparation of $MAPbI_2Br$, $MAPbIBr_2$, and $MAPbBr_3$, the starting precursors used were MABr:$PbI_2$::1:1, MAI:$PbBr_2$::1:1, and MAI:$PbBr_2$::1:1, respectively.

FIG. 1A is a schematic diagram depicting the solution-processing method described herein and referred to as "solvent-solvent extraction" or SSE wherein a co-solvent system is used to precipitate organometallic halides on the surface of a substrate. In the case of deposition of the hybrid perovskite $MAPbI_3$, the first step involves room-temperature spin-coating of a solution of stoichiometric MAPbI$_3$ in NMP—a high-boiling-point (202° C.) polar solvent—on substrates. Other deposition methods, such as dip-coating, spraying, or inkjet-printing, can also be used to deposit the MAPbI$_3$ precursor solution. The clear spin-coated MAPbI$_3$ precursor thin film is immersed in a room-temperature bath of diethyl ether (C$_2$H$_5$OC$_2$H$_5$ or DEE)—a low-boiling-point non-polar solvent. Within seconds colored specks appear on the film, and it starts to turn dark uniformly, indicating the rapid formation of MAPbI$_3$ perovskite. Within two minutes NMP solvent extraction and simultaneous crystallization of the MAPbI$_3$ perovskite is complete. The substrate with the thin film of crystallized perovskite is then taken out from the bath and dried rapidly in ambient air.

FIG. 2A is a photograph of a substrate that has been spin-coated with a thin film of MAPbI$_3$. FIG. 2B is a photograph of the substrate submerged or immersed in a vial of a volume of diethyl ether after 2 seconds showing MAPbI$_3$ coating formation indicated by the dark yellow or brownish color. FIG. 2C is a photograph of the substrate submerged or immersed in a vial of a volume of diethyl ether after 2 minutes showing MAPbI$_3$ coating formation indicated by the brownish color.

FIG. 3 is a sequence of photographs after submerging a spin-coated MAPbI$_3$ precursor thin film (patterned) in diethyl ether solvent showing rapid MAPbI$_3$ perovskite thin film formation. FIG. 4 is a sequence of photographs after adding drops of MAPbI$_3$ precursor solution (in NMP) in diethyl ether bath showing sluggish MAPbI$_3$ perovskite precipitate formation compared to that in FIG. 3. This indicates that the thin film formation of the solution of the organometallic halide and the solvent is advantageous in the formation of a layer or coating or film of the crystallized organometallic halide on the surface of the substrate.

EXAMPLE II

Material Characterization

X-ray diffraction (XRD) was performed on a X-ray diffractometer (D-8 Discover, Bruker, Germany) using Cu Kα$_1$ radiation (λ=1.5406 Å) at a step size of 0.02°. XRD patterns for the confirmation of the perovskite phase were collected using a Ge (002) monochrometer, at step time of 2 seconds. For XRD patterns for the tracking of the SSE process, the step time was 1 second, and the monochrometer was not used.

The surface and cross-sections (fractured) morphology of thin films were characterized using a scanning electron microscope (SEM; LEO 1530VP, Carl Zeiss, Germany).

Transmission electron microscopy (TEM) was used to characterize cross-sections of the solar cell devices. Samples from specific locations on the cross-sections were prepared by focused ion beam (FIB; Helios 600, FEI, Hillisboro, Oreg.) and in situ lift-out. In the case of plan-view high-resolution TEM, the SSE processed perovskite was deposited directly on a Cu grid covered with holey carbon (EMS, Hatfield, Pa.). The spin-coating conditions used were identical to those used to deposit 80 nm perovskite thin films. All TEM samples were examined using TEM (2100F, JEOL, Tokyo, Japan) operated at 200 kV accelerating voltage.

The optical spectroscopy (transmission, refection and absorption) of SSE perovskite thin films on compact TiO$_2$-coated FTO were conducted at a step size of 10 nm on a Cary 6000i UV-vis-NIR spectrophotometer equipped with diffuse reflectance accessories (Agilent Technologies, Englewood, Colo.).

Atomic force microscopy (AFM) images were obtained in tapping mode (Veeco 5000 and Nanoscope V, Plainview, N.Y.) using a probe with tip radius of about 10 nm and resonance frequency of about 300 kHz (Olympus AC160TS, Plympus, Japan). The AFM system is setup in an Ar glove box with H$_2$O and O$_2$ concentrations less than 0.1 ppm.

FIG. 1B shows an indexed X-ray diffraction (XRD) pattern from an about 250 nm thick perovskite thin film deposited using the SSE method on a glass substrate, confirming pure-MAPbI$_3$ tetragonal phase (space group 14/mcm). FIGS. 1C and 1D are scanning electron microscope (SEM) images of a top surface of a typical SSE MAPbI$_3$ perovskite thin film (about 200 nm thickness), deposited on a fluorinated tin oxide (FTO) coated glass substrate with an about 20 nm TiO$_2$ hole-blocking layer, at low and high magnifications, respectively. The uniform, dense coverage is readily apparent from these micrographs, and the grain size is found to be about 200 nm.

FIG. 5A is a cross-sectional SEM image of an about 250 nm SSE MAPbI$_3$ perovskite thin film, showing uniform coverage and thickness. Cross-section of a thinner (about 80 nm) SSE MAPbI$_3$ perovskite thin film viewed in the transmission electron microscope (TEM; bright-field image) is presented in FIG. 5B, showing uniform, conformal coverage. FIGS. 5C and 5D are high-resolution TEM images of MAPbI$_3$ perovskite deposited on TEM grids using the SSE method. The about 8.8 Å interplanar spacing in FIG. 5D corresponds to (100) or (010) planes (lattice parameters a=b=8.849 Å, c=12.642 Å (See C. C. Stoumpos, C. D. Malliakas, M. G. Kanatzidis, *Inorg. Chem.* 52, 9019-9038 (2013)), further confirming the -MAPbI$_3$ tetragonal phase. Proliferation of crystal defects are also observed in FIG. 5C, which is typical of soft organic-inorganic hybrid materials. The atomic force microscope (AFM) images in FIG. 5E (40×40 m$^2$) and FIG. 5F (2×2 m$^2$) of the top surface of a SSE MAPbI$_3$ perovskite thin film (thickness about 250 nm) reveal root mean square (RMS) roughness of about 4.0 nm and about 5.2 nm, respectively, showing unprecedented smoothness over a large area. The highly reflective nature of the film is shown in the photograph in FIG. 5H, and the photograph in FIG. 5G demonstrates the semitransparent nature of the SSE MAPbI$_3$ perovskite thin film (thickness about 350 nm) over a 5×6 cm$^2$ area viewed in bright sunshine.

Figure 6B:
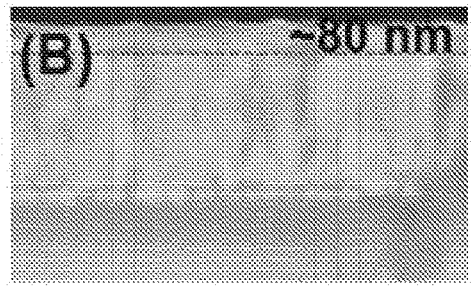
Figure 6C:
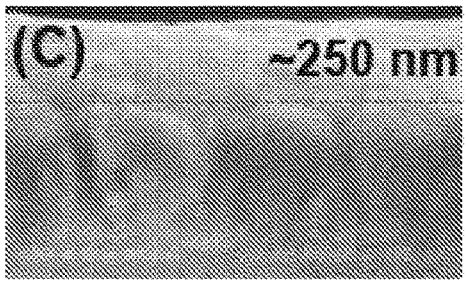
Figure 6D:
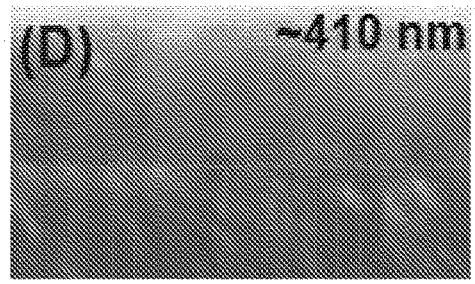
Figure 7:
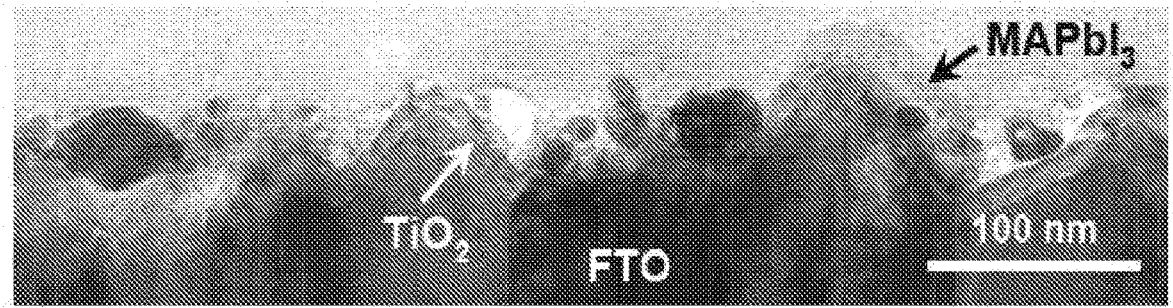
FIG. 7 is a TEM image of a perovskite film deposited on a TiO$_2$ blocking layer coated FTO glass substrate.
Figure 9:
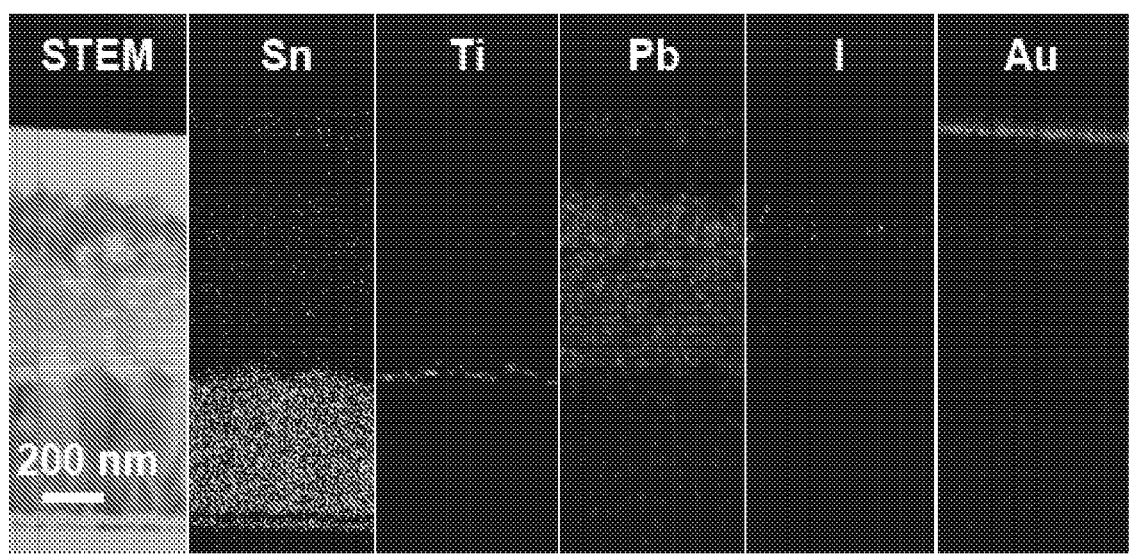
FIG. 9 is an elemental EDS mapping of the solar cell of FIG. 8(A)-8(D).

FIG. 6A-6D are cross-sectional SEM images of MAPbI$_3$ perovskite films of various thicknesses deposited on TiO2-blocking-layer coated FTO-glass substrates using the SSE process at room temperature, and the corresponding photographs demonstrating semitransparency: FIG. 6A is about 50 nm, FIG. 6B is about 80 nm, FIG. 6C is about 250 nm, and FIG. 6D is about 410 nm. FIG. 7 is a cross-sectional bright-field TEM image of an about 20 nm MAPbI$_3$ perovskite film deposited on TiO$_2$-blocking-layer coated FTO-glass substrates. FIG. 8A-8D are bright field TEM images of a typical MAPbI$_3$ perovskite-based solar cell device, where the MAPbI$_3$ thin film (about 700 nm thickness) is deposited using the SSE process at room temperature: FIG. 8A is an overall view. FIG. 8B is a detailed view of region "B" showing hole-transporting material (HTM) and MAPbI$_3$. FIG. 8C is a detailed view of region "C" showing MAPbI$_3$ grains, and FIG. 8D is a detailed view of region "D" showing MAPbI$_3$, TiO$_2$ blocking layer and FTO. The thickness of the MAPbI$_3$ layer in this solar cell is unusually thick, and Au was used as the top contact instead of Ag used in other cells. FIG. 9 depicts images of elemental EDS mapping of the solar cell device in FIG. 7 showing the distribution of elements Sn, Ti, Pb, I, and Au. FIG. 10A-10C depict optical properties of MAPbI$_3$ perovskite films of various thicknesses deposited on TiO$_2$-blocking-layer coated FTO-glass substrates using the SSE process at room temperature: FIG. 10A shows transmission. FIG. 10B shows reflection. FIG. 10C shows absorption. Inset in FIG. 10B are photographs of the films.

Figure 11A:
FIG. 11A depicts XRD patterns from an MAPbI$_3$ precursor as-spin-coated film (in NMP) on a glass substrate.
Figure 11B:
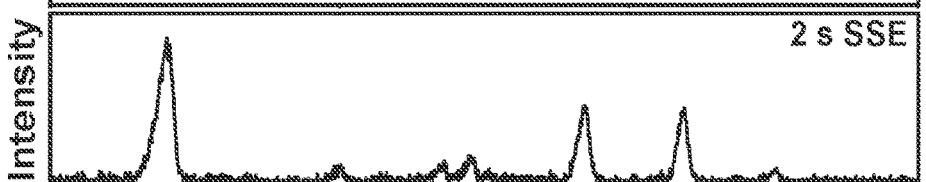
FIG. 11B depicts XRD patterns from an MAPbI$_3$ precursor as-spin-coated film (in NMP) on a glass substrate after 2 s of NMP extraction by dimethyl ether solvent at room temperature.
Figure 11C:
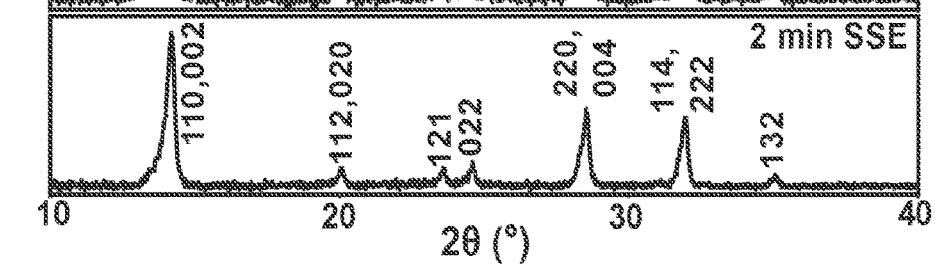
FIG. 11C depicts XRD patterns from an MAPbI$_3$ precursor as-spin-coated film (in NMP) on a glass substrate after 2 min of NMP extraction by dimethyl ether solvent at room temperature. Note the sharpening of the XRD peaks in FIG. 11C.
Figure 11D:
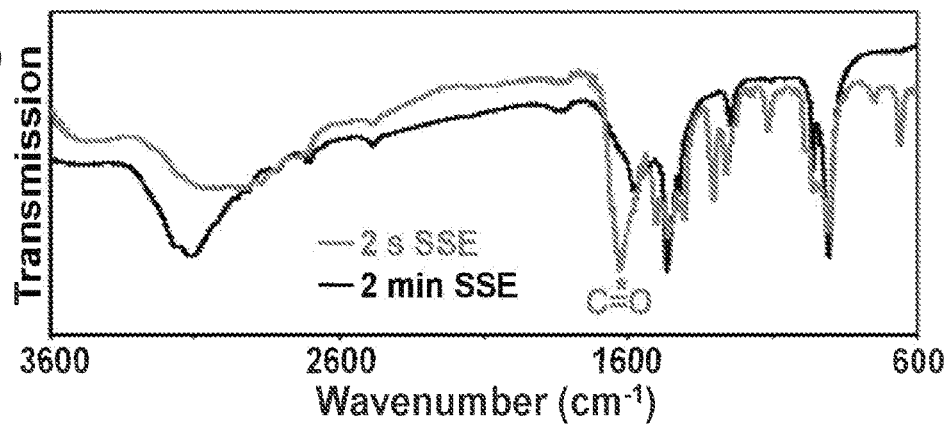
FIG. 11D is an FTIR spectra corresponding to FIG. 11B after 2 s (red) and FIG. 11C after 2 min (black). The C=O stretching band at ~1700 cm$^{-1}$ observed in the 2-s film is marked.
Figure 11E:
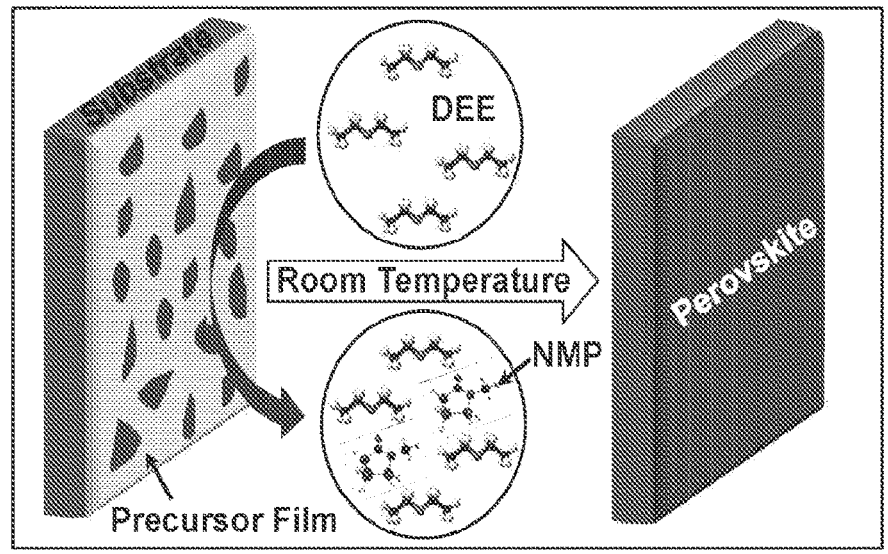
FIG. 11E is a proposed schematic illustration of an exemplary solvent-solvent extraction mechanism.

FIGS. 11A-11C are X-ray diffraction (XRD) patterns following the progression of the SSE deposition process on a glass substrate. FIG. 11A shows featureless XRD pattern from the as-spin-coated MAPbI$_3$ precursor solution thin film, while FIG. 11B shows the formation of MAPbI$_3$ perovskite after 2 seconds of NMP-solvent extraction. Upon further NMP extraction (2 minutes), the XRD pattern become sharper, where the strongest reflection in FIG. 11C is narrower (FWHM 2 0.31°) compared to that in FIG. 11B (FWHM 2~0.61°), showing the formation of phase-pure β-MAPbI$_3$ perovskite (film thickness about 250 nm). Fourier-transform infrared (FTIR) spectra from the films corresponding to FIG. 11B (2 seconds) and FIG. 11C (2 min) are presented in FIG. 11D. The presence of C=O stretching band at about 1700 cm$^{-1}$ observed in the 2 second spectrum (red) is indicative of the presence of some NMP remaining in the thin film, but it disappears in the fully solvent-extracted thin film at 2 minutes (black). Based on these observations it appears that as soon as the MAPbI$_3$ precursor film comes in contact with DEE, the NMP solvent is extracted selectively as NMP is highly miscible in DEE. This may occur in localized patches in the very early stages which can be due to local compositional variations in the film and/or the DEE solvent in contact with the film. The crystallization of MAPbI$_3$ perovskite is triggered in areas devoid of NMP, which spreads rapidly to cover the entire area as all the NMP is extracted by DEE. The process of extracting the NMP solvent by the DEE solvent and deposition of organometallic halide crystals is schematically depicted in FIG. 11E. Since MAPbI$_3$ perovskite is insoluble in non-polar DEE and the process is so rapid, the crystallized film is not damaged during this room-temperature process. Finally, the lower boiling point of DEE (35° C.), compared to the precursor solvents (NMP 204° C.), allows ambient drying to remove any remaining DEE solvent.

While the NMP/DEE precursor/extracting solvents combination used here is a typical example for the demonstration of the SSE method, a wide range of other solvents, or mixed solvents, can be used to suit the specific perovskite being deposited. According to certain aspects, an exemplary precursor solvent (polar) has a high solubility for perovskite precursor, allows deposition of films with wide range of uniform thicknesses, and a high boiling point, preventing evaporation-induced unbalanced perovskite growth and/or the possible formation of complexes. An exemplary extracting solvent (non-polar) has no or substantially no solubility for the perovskite precursors, it does not react with the solid perovskites, and it has a low boiling point, allowing rapid drying in ambient conditions. An exemplary precursor solvent is highly miscible in the extracting solvent, and it disperses rapidly, enabling rapid SSE deposition.

EXAMPLE III

Solar Cell Fabrication and Testing

For the fabrication of the solar cells, FTO-coated glass was patterned by hydrochloric acid etching with zinc powder, and cleaned by soaking in a base bath (5 wt % NaOH in ethanol) overnight. After washing using deionized water and ethanol, a compact TiO$_2$ layer was deposited on top of patterned FTO by spray pyrolysis at 450° C. The perovskite layer was then deposited as described above in Example I. This was followed by spin-coating a solution of hole transporting materials (HTMs), which included 80 mg 2,2',7,7'-tetrakis(N,N-dip-methoxyphenylamine)-9,9'-spirobifluorene (Spiro-MeOTAD; Merck, Germany), 30 μl bis(trifluoromethane)sulfonimide lithium salt stocking solution (500 mg Li-TFSI in 1 ml acetonitrile), and 30 μl 4-tert-butylpyridine (TBP), and 1 ml chlorobenzene solvent. Finally a 150 nm Ag layer was deposited using a thermal evaporator and a shadow mask. The cells were stored in a dry-air atmosphere with humidity below 10%, and typically the performance of the solar cell was measured one day after fabrication. The incident photon-to-current efficiency (IPCE) or external quantum efficiency spectra were recorded at a chopping frequency of 5 Hz in AC mode on a solar cell quantum efficiency measurement system (QEX10, PV Measurements, Boulder, Colo.). The J-V characteristics of the cells were obtained using a 2400 SourceMeter (Keithley, Cleveland, Ohio) under simulated one sun AM 1.5 G illumination, 100 mW·cm$^{-2}$ (Oriel Sol3A class AAA Solar Simulator, Newport Corporation, Irvine, Calif.). Typical sweeping of forward bias voltage started from 0 V to V$_{OC}$+50 mV and back to 0 V, at the rate of 20 mV s$^{-1}$. A typical active area of 0.16 cm$^2$ was defined using a non-reflective mask for the J-V measurements. Using a procedure suggested by H. J. Snaith, *J. Phys. Chem. Lett.* 4, 3623-3630 (2013), the maximum power output stability of the solar cells was measured by monitoring the current density (J) output at the maximum power voltage (V) bias for up to 300 seconds using a VersaSTAT MC potentiostat (Princeton Applied Research, Acton, Mass.). The current output can be converted to PCE output using the following relation: PCE=[J (mA·cm$^{-2}$)×V (V)]/[100 (mW·cm$^{-2}$)]. A shutter used to control the one-sun illumination on the cell. The stabilizing output PCEs at maximum power point of the SSE perovskite solar cells is close to the calculated PCEs from the reverse scan J-V response at the measurement conditions described above. The cell testing was conducted in an ambient atmosphere with humidity of 20-40%. Impedance spectroscopy (IS) on the solar cells was performed using a PARSTAT 2273 workstation (Princeton Applied Research, Acton, Mass.) with the frequency range of 0.1 Hz-100 kHz and the modulation amplitude of 10 mV. The IS spectra were analyzed using ZView 2.9c software (Scribner Associates, Southern Pines, N.C.).

Figure 12A:
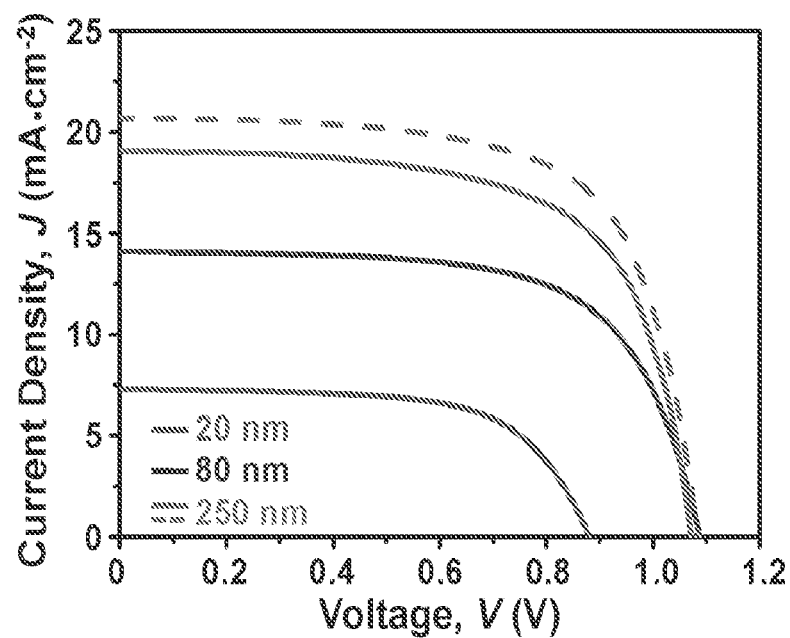
FIG. 12A depicts current density (J)-voltage (V) characteristics of solar cells based on MAPbI$_3$ perovskite thin films with different thicknesses deposited by a solvent-solvent extraction method as described herein at room temperature under simulated one-sun AM 1.5 G (100 mW·cm$^{-2}$) illumination (0.16 cm$^2$ active area). The dashed red J-V curve is for a solar cell with highest PCE of 15.2%.

FIG. 12A presents typical current density (J)-voltage (V) curves under simulated one-sun AM 1.5 G (100 mW·cm$^{-2}$) illumination of solar cells fabricated using SSE MAPbI$_3$ perovskite thin films of thickness about 20 nm, about 80 nm, and about 250 nm. The solar-cell performance parameters extracted from these data are presented in Table 1 below with * representing the solar cell with highest PCE.

| SSE Perovskite Thickness | $J_{SC}$ (mA.cm$^{-2}$) | FF | $V_{OC}$ (V) | PCE (%) |
|---|---|---|---|---|
| 20 nm | 7.3 | 0.638 | 0.88 | 4.1 |
| 80 nm | 14.1 | 0.663 | 1.08 | 10.1 |
| 250 nm | 19.0 | 0.659 | 1.07 | 13.4 |
| 250 nm* | 20.7 | 0.680 | 1.08 | 15.2 |

Figure 12B:
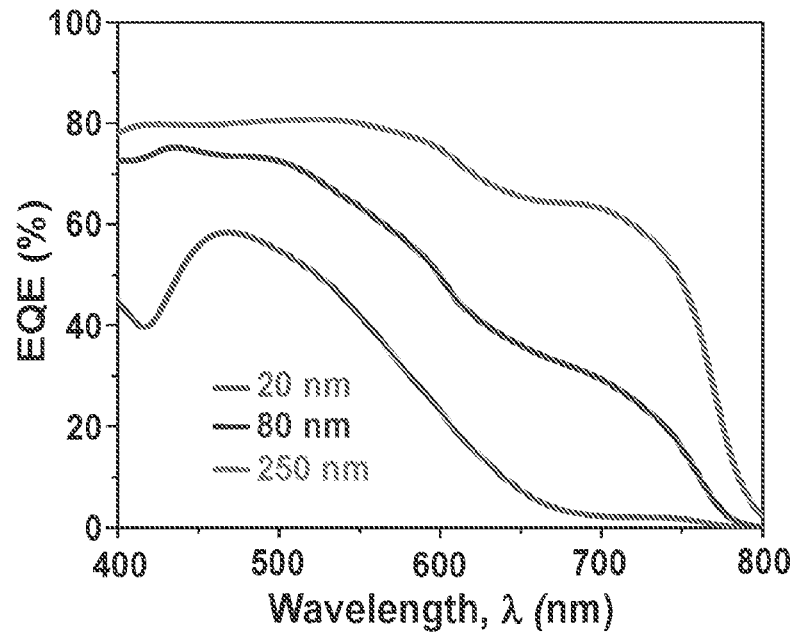
FIG. 12B is a graph of external quantum efficiency (EQE) as a function of wavelength for the solar cells in FIG. 12A.
Figure 13:
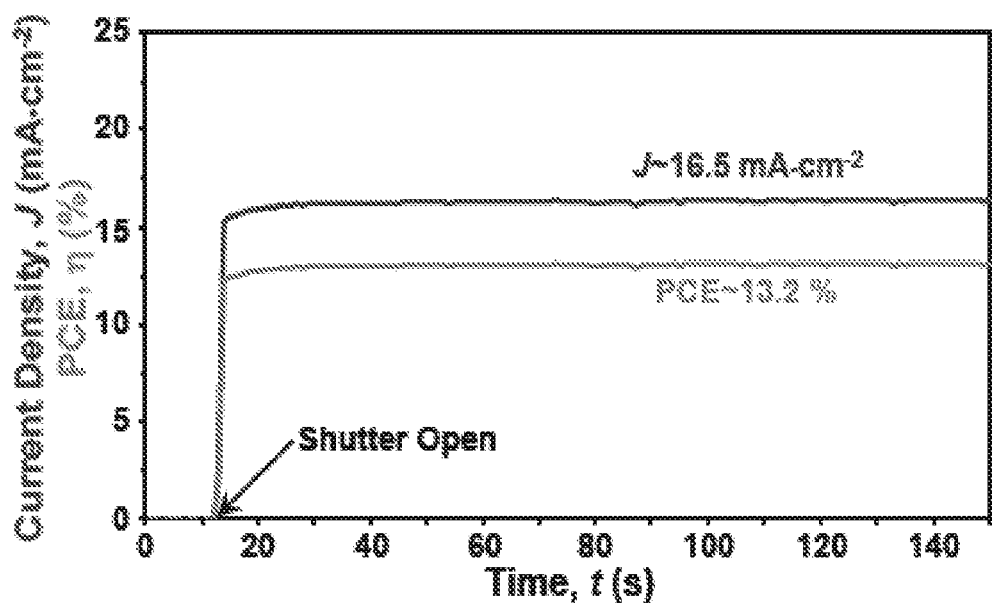
FIG. 13 is a graph of PCE versus time.

When the perovskite film thickness is about 20 nm, the solar cell exhibits a PCE of 4.1% with a short-circuit photocurrent density ($J_{SC}$) of 7.3 mA·cm$^{-2}$, open-circuit voltage ($V_{OC}$) of 0.88 V, and fill factor (FF) of 0.638. The device PCE increases to 10.1% and 13.4% when the perovskite film thickness is increased to about 80 and about 250 nm, respectively. The highest PCE observed is 15.2% for a solar cell with about 250 nm perovskite film thickness. The improved efficiency with increasing perovskite film thickness is mainly the result of the larger $J_{SC}$ values associated with the increased optical absorption. The $J_{SC}$ values for these perovskite cells are consistent with their respective external quantum efficiency (EQE) spectra which are shown in FIG. 12B. To verify the PCE values determined from the J-V characteristics, the stable, maximum power output under continuous one-sun illumination is measured. FIG. 13 shows that for a typical solar cell made using about 250 nm SSE MAPbI$_3$ perovskite thin film, the maximum power output stabilizes at about 13.2% over several minutes, which compares favorably with the values obtained from the J-V curve (13.4%; FIG. 12A). FIG. 13 depicts stability of current density (J) and PCE (η) as a function of time for a solar cell device based on MAPbI$_3$ perovskite thin film (about 250 nm thickness) under simulated one-sun AM 1.5 G (100 mW/m2) illumination (0.16 cm2 active area).

Figure 14:
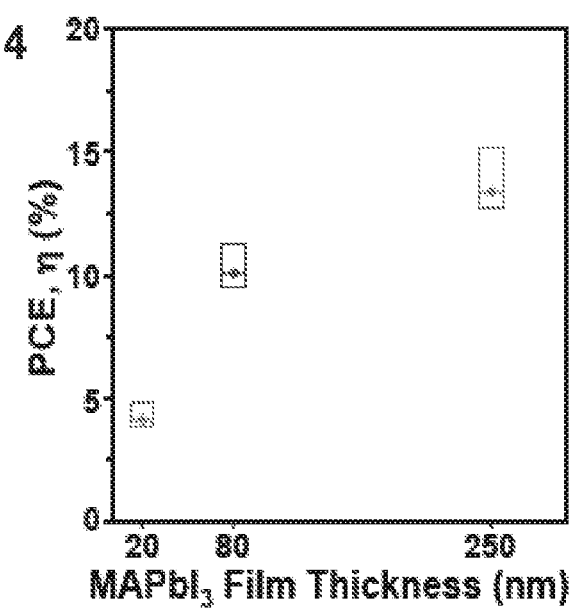
FIG. 14 is a graph of PCE versus MAPbI$_3$ thickness.

The mean, maximum, and minimum PCE values for 10-20 solar cells tested for each perovskite thickness are presented in FIG. 14. The tight distribution of PCE values indicates that the SSE method for MAPbI$_3$ perovskite thin film deposition is reproducible. While the highest PCE of 15.2% is for cells based on about 250-nm thickness films, PCE of over 10% for solar cells made from an about 80-nm thick MAPbI$_3$ perovskite film were achieved. When the film thickness is reduced down to about 20 nm, an average PCE of 4.1% is achieved.

Figure 15A:
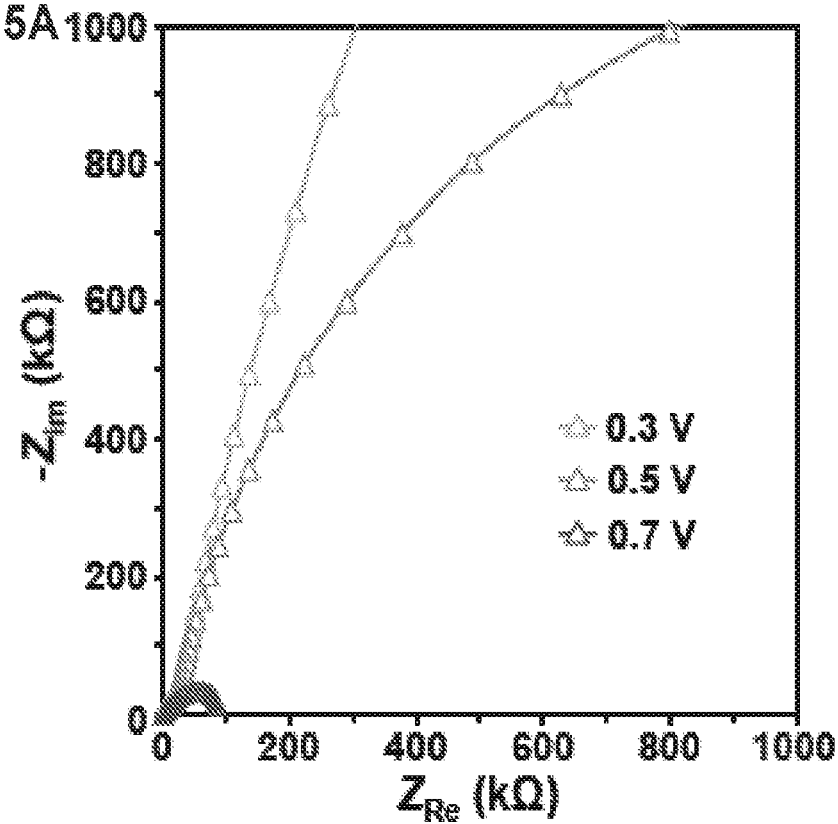
FIG. 15(A) is a Nyquist plot of impedance resistance.
Figure 15B:
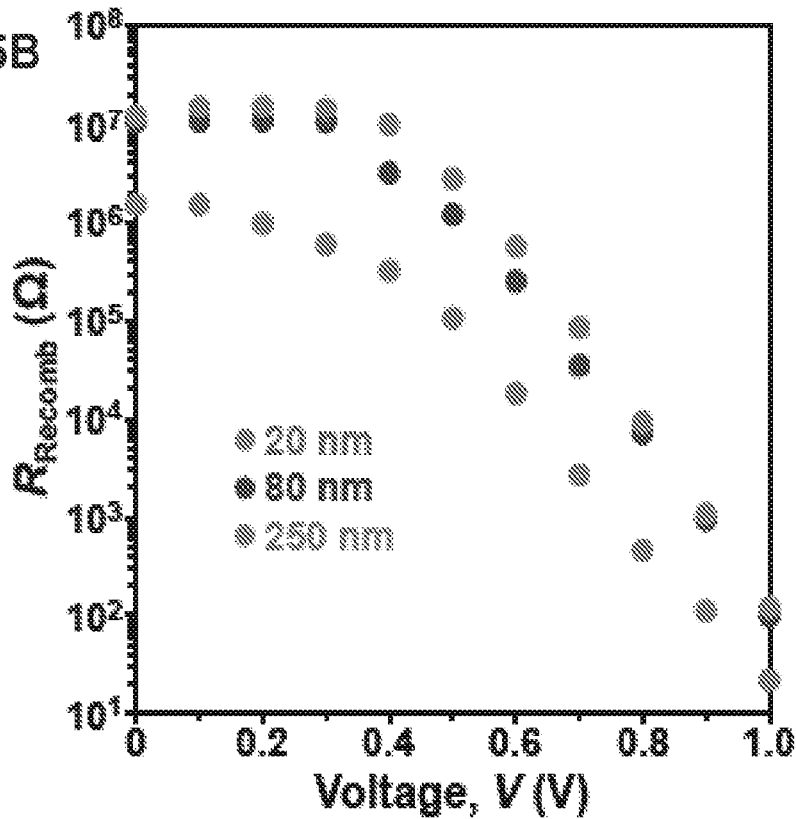
FIG. 15(B) is a plot of recombination resistance as a function of voltage.

Impedance analyses show that the smaller recombination resistance for the 20 nm solar cell accounts for the observed lower $V_{OC}$ compared to the 80-250-nm solar cells. Impedance spectroscopy was used to investigate the effect of perovskite film thickness on the recombination resistance ($R_{Recomb}$) for perovskite solar cells based on MAPbI$_3$ thin films prepared with the SSE method. FIG. 15A shows a typical Nyquist plot of impedance spectra in the complex plane for a 250-nm perovskite cell under three different bias voltages. The impedance spectra for all three bias voltages are dominated by a large semicircle at low frequencies. This large semicircle is often attributed to the charge recombination process within the perovskite solar cells. The model used for impedance analysis has been previously discussed in detail (see J. A. Christians, et al., *J. Am. Chem. Soc.* 136, 758-764 (2014); H.-S. Kim, et al., *Sci. Rep.* 2, 591 (2012); E. J. Juarez-Perez, et al., *J Phys. Chem. Lett.* 5, 680-685 (2014).) FIG. 15B compares the recombination resistance $R_{Recomb}$ as a function of voltage for MAPbI$_3$ perovskite solar cells with three different film thicknesses. The $R_{Recomb}$ for all three samples depends strongly on the bias voltage, following a similar voltage dependence. When compared at a fixed voltage, the $R_{Recomb}$ values for the 20-nm sample are significantly (about a factor of 5-10) smaller than the cells with 80-250 nm thick perovskite layers. A smaller $R_{Recomb}$ corresponds to a faster recombination rate, which could account for the observed lower $V_{OC}$ for the 20-nm film solar cell compared to that for the 80-250-nm film solar cells.

EXAMPLE IV

Thickness and Composition Control of Perovskite Thin Coatings

Figure 16A:
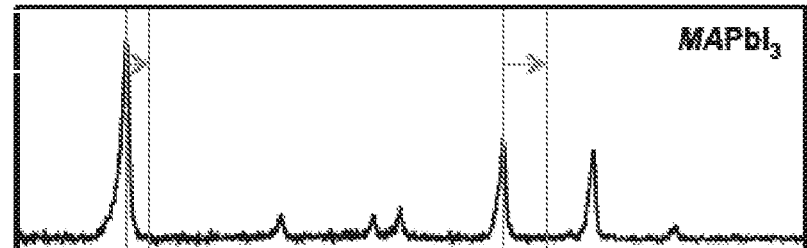
FIG. 16(A)-16(D) are XRD patterns from MAPbI$_{(3-x)}$Br$_x$ perovskite films deposited on glass substrates.
Figure 16B:
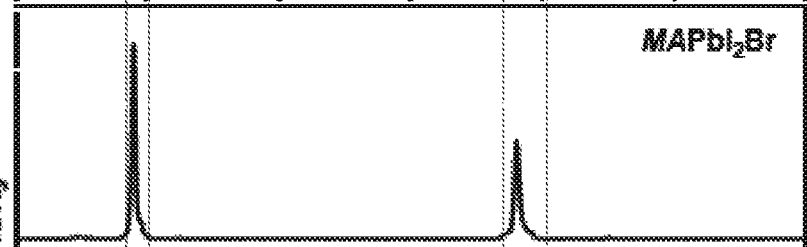
Figure 16C:
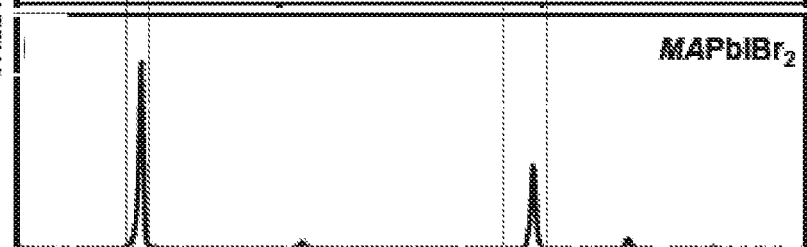
Figure 16D:
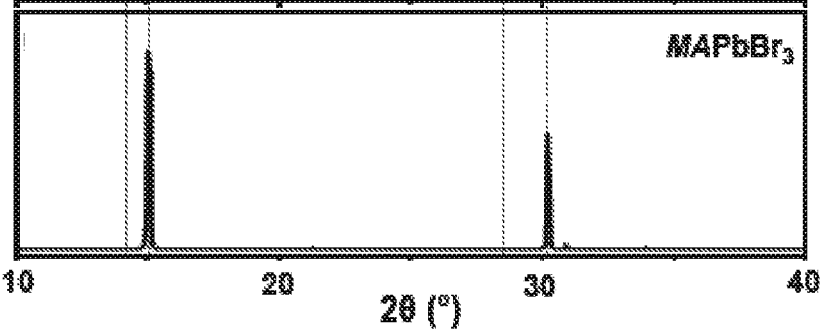
Figure 17:
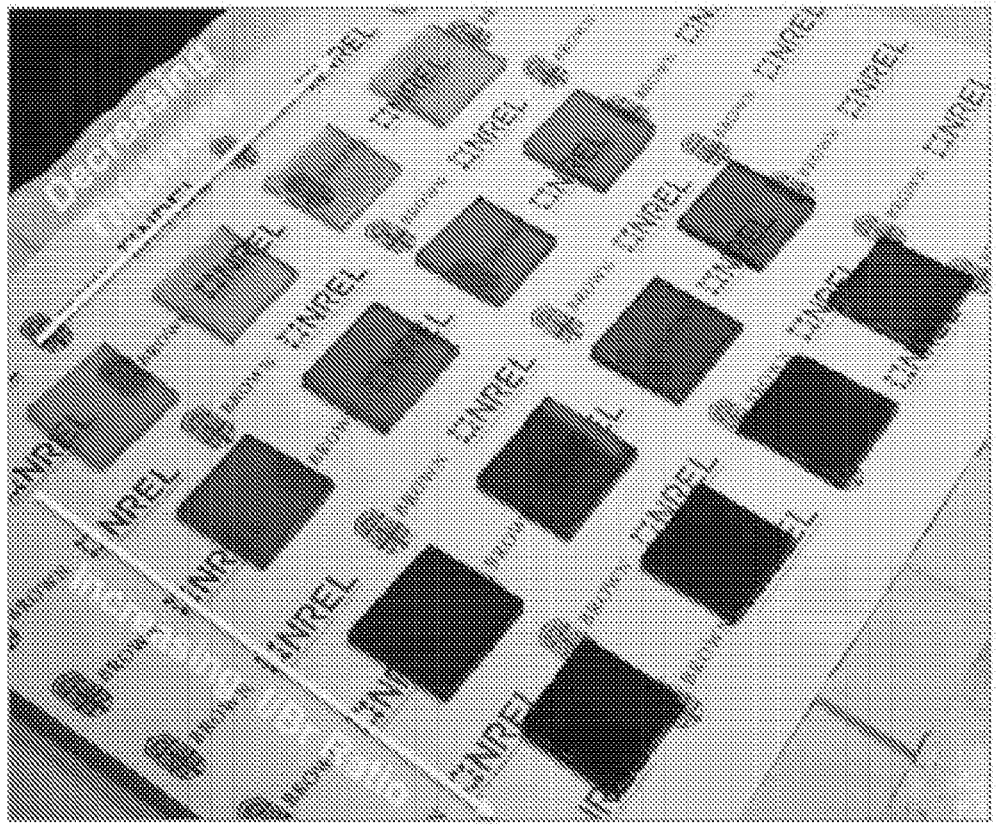
FIG. 17 are photographs of MAPbI$_{(3-x)}$Br$_x$ perovskite films deposited on TiO$_2$ blocking layer coated FTO-glass substrates.

The methods described herein are highly versatile and can be used to deposit semitransparent thin films or coatings of MAPbI$_{(3-x)}$Br$_x$ (x=1, 2, or 3) perovskites with vivid colors, which can be tuned via thickness and composition (I/Br ratio) control. FIGS. 16A-16D show XRD patterns from MAPbI$_{(3-x)}$Br$_x$ perovskite films deposited on glass substrates using the SSE process at room temperature: FIG. 16A x=0, FIG. 16B x=1, FIG. 16C x=2, and FIG. 16D x=3. The peak shift due to change in the lattice parameters is denoted by the dashed red lines and the arrows. FIG. 17 show photographs of MAPbI$_{(3-x)}$Br$_x$ perovskite films deposited on TiO$_2$-blocking-layer coated FTO-glass substrates using the SSE process at room temperature as a function of I/Br ratio 0 to 3 and thickness in the range about 20 nm to about 250 nm, demonstrating that the semitransparency and color can be tuned through these variables.

Figure 18:
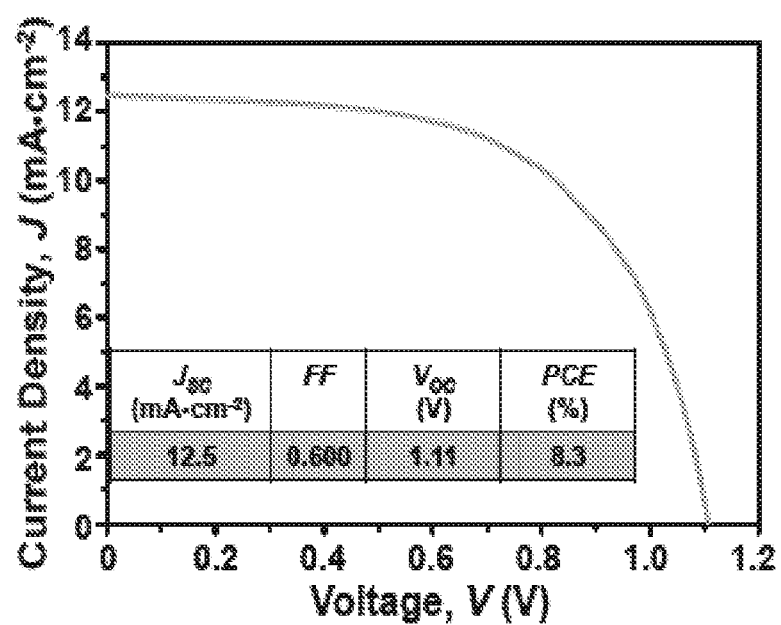
FIG. 18 is a graph of J-V characteristics and extracted performance parameters for a solar cell having a perovskite film deposited using the methods described herein.

Typical solar cells based on about 80-nm thick SEE MAPbI$_2$Br films (1.8 eV band gap (see Y. Zhao, K. Zhu, *J. Am. Chem. Soc.* 136, 12241-12244 (2014)) deliver a promising PCE of 8.3% as per FIG. 18 which shows J-V characteristics and extracted performance parameters for a solar cell device based on MAPbI$_2$Br perovskite thin film (~80 nm thickness) under simulated one sun AM 1.5 G (100 mW/m2) illumination (0.16 cm2 active area). The high PCEs in semitransparent, colorful solar cells with low lead content is advantageous for large-scale architectural applications such as decorative panels and windows. Also, the room-temperature nature of the solvent-solvent extraction process makes it highly compatible with the fabrication of tandem-architecture solar cells and continuous roll-to-roll manufacturing.

It is to be understood that the embodiments of the present invention which have been described are merely illustrative of some of the applications of the principles of the present invention. Numerous modifications may be made by those skilled in the art based upon the teachings presented herein without departing from the true spirit and scope of the invention. The contents of all references, patents and published patent applications cited throughout this application are hereby incorporated by reference in their entirety for all purposes.

What is claimed is:

1. A method of making a coated substrate comprising:
    room temperature spin coating of a first solution and an organometallic halide on a surface of a substrate;
    immersing the coated substrate in a room temperature bath of a second solution, the second solution causing the organometallic halide to precipitate from the first solution onto the surface, forming an organometallic halide coating;
    removing the substrate from the bath; and
    rapidly drying the substrate in ambient air.

2. The method of claim 1 wherein the coating of the solution is formed by applying the solution to the surface of the substrate and removing a portion of the first solvent.

3. The method of claim 1 wherein the organometallic halide is RMe$_n$X$_y$ wherein Me is Cu, Co, Ni, Fe, Mn, Pd, Cd, Sn, Pb, Ge, Eu or Yb; X is one or more of I, Br, Cl; y is 3 or (3n+1); n is 1, 2, 3, 4, 5; R is an organic group, CH$_3$NH$_3$, NH$_3$CH=CH$_2$, Cs, (R'—NH$_3$)$_2$, (NH$_3$—R'—NH$_3$)$_2$ or (R'—NH$_3$)$_2$R$_{(n-1)}$; and R' is alkyl, C$_1$ to C4 alkyl or C$_6$H$_5$C$_2$H$_4$; with the proviso that when y is 3, n is 1, Me is Pb, Sn, Ge, Eu or Yb and R is an organic group, CH$_3$NH$_3$ or NH$_3$CH=CH$_2$, or Cs, and further with the proviso that when y is (3n+1) and n is 1, Me is Cu, Co, Ni, Fe, Mn, Pd, Cd, Sn, Pb, Ge, Eu or Yb, and R is (R'— NH$_3$)$_2$ or (NH$_3$—R'— NH$_3$)$_2$ and further with the proviso that when y is (3n+1) and n is 2, 3, 4, or 5, Me is Cu, Co, Ni, Fe, Mn, Pd, Cd, Sn, Pb, Ge, Eu or Yb and R is (R'— NH$_3$)$_2$R$_{(n-1)}$.

4. The method of claim 1 wherein the organometallic halide is $RMeX_3$ wherein R is an organic group or Cs, Me is Pb, Sn, Ge, Eu or Yb and X is one or more of I, Br, Cl.

5. The method of claim 1 wherein the organometallic halide is $RMeX_3$ wherein R is Cs or an organic group selected from the group consisting of $CH_3NH_3$ or $NH_2CH=CH_2$, Me is Pb, Sn, Ge, Eu or Yb and X is one or more of Cl, Br, or I.

6. The method of claim 1 wherein the organometallic halide is $CH_3NH_3PbI_3$.

7. The method of claim 1 wherein the organometallic halide is $(R-NH_3)_2MeX_4$ wherein R is alkyl or $C_6H_5C_2H_4$, Me is a transition metal or a rare earth metal and X is one or more of Cl, Br, or I.

8. The method of claim 1 wherein the organometallic halide is $(R-NH_3)_2MeX_4$ wherein R is $C_1$ to $C_4$ alkyl or $C_6H_5C_2H_4$, Me is Cu, Co, Ni, Fe, Mn, Pd, Cd, Sn, Pb Eu or Yb and X is one or more of Cl, Br, or I.

9. The method of claim 1 wherein the organometallic halide is $(NH_3-R-NH_3)_2MeX_4$ wherein R is alkyl or $C_6H_5C_2H_4$, Me is a transition metal or a rare earth metal and X is one or more of Cl, Br, or I.

10. The method of claim 1 wherein the organometallic halide is $(NH_3-R-NH_3)_2MeX_4$ wherein R is $C_1$ to $C_4$ alkyl or $C_6H_5C_2H_3$, Me is Cu, Co, Ni, Fe, Mn, Pd, Cd, Sn, Pb, Eu or Yb and X is one or more of Cl, Br, or I.

11. The method of claim 1 wherein the organometallic halide is $(R'NH_3)_2(R)_{(n-1)}Me_nX_{(3n+1)}$ wherein R' is $C_1$ to $C_4$ alkyl or $C_6H_5C_2H_4$, R is Cs, $CH_3NH_3$ or $NH_2CHCH_2$, Me is Cu, Co, Ni, Fe, Mn, Pd, Cd, Sn, Pb, Eu or Yb, X is one or more of Cl, Br, or I and n is 2, 3, 4, or 5.

12. The method of claim 1 wherein the first solvent is a polar solvent having a boiling point within the range of 100° C. and 300° C.

13. The method of claim 1 wherein the first solvent is dimethylformamide, dimethylsulfoxide, γ-butyrolactone, n-methyl-2-pyrrolidone, dimethylacetamide or dimethylphosphoramide.

14. The method of claim 1 wherein the second solvent is a nonpolar solvent having a boiling point within the range of 0° C. and 100° C.

15. The method of claim 1 wherein the second solvent is diethyl ether, pentane, cyclopentane, hexane, cyclohexane, benzene, chloroform, carbon disulphide, cardon tetrachloride, dibutyl ether, diethylamine, trichloroethylene, triethylamine or dichloromethane.

16. The method of claim 1 wherein the organometallic halide precipitating onto the surface of the substrate forming a coating and the coated substrate is carried out at a temperature between 10° C. and below 70° C.

17. The method of claim 1 wherein the organometallic halide precipitating onto the surface of the substrate forming a coating and the coated substrate is carried out at a temperature between 10° C. and 50° C.

18. The method of claim 1 wherein the organometallic halide precipitating onto the surface of the substrate forming a coating and the coated substrate is carried out at a temperature of between 20° C. and 30° C.

19. The method of claim 1 wherein the organometallic halide precipitating onto the surface of the substrate forming a coating and the coated substrate is carried out at a temperature of between 18° C. and 23° C.

20. The method of claim 1 wherein the coating has a thickness of between 20 nm and 2 μm.

21. The method of claim 1 wherein the substrate surface includes one or more of a polymer, glass, ceramic, or metal.

22. The method of claim 1 wherein the second solvent extracts the first solvent forming a miscible mixture of the second solvent and the first solvent and the organometallic halide crystallizes from solution onto the surface of the substrate.

23. The method of claim 1 wherein the solution is applied to the substrate by spin coating, dip coating, spray coating, or ink jet printing.

24. The method of claim 1 wherein the first solvent and the second solvent is removed from the coated substrate.

25. The method of claim 1 wherein the coated substrate is dried at a temperature of between 18° C. and 100° C.

26. The method of claim 1 wherein the coating has an average uniform surface roughness of between about 1 nm and 20 nm (root mean square) as measured using an atomic force microscope.

27. The method of claim 1 wherein applying the second solvent to the surface of the substrate and contacting the solution is carried out by immersing the substrate in the second solvent.

* * * * *